United States Patent
Barnette et al.

(10) Patent No.: US 6,519,553 B1
(45) Date of Patent: Feb. 11, 2003

(54) MULTIPROCESSOR COMPUTER OVERSET GRID METHOD AND APPARATUS

(75) Inventors: Daniel W. Barnette, Veguita, NM (US); Curtis C. Ober, Los Lunas, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 09/078,895

(22) Filed: May 14, 1998

(51) Int. Cl.[7] .......................... G06F 17/50; G06F 17/17
(52) U.S. Cl. ............................... 703/2; 703/22; 709/105
(58) Field of Search ...................... 703/2, 22; 709/100, 709/104, 105, 106, 245

(56) References Cited

U.S. PATENT DOCUMENTS 5,371,852 A * 12/1994 Attanasio et al. ........... 709/245

OTHER PUBLICATIONS

Silver et al., D. Tracking and Visualizing Turbulent 3D Features, IEEE Transactions on Visualization and Computer Graphics, vol. 3, No. 2, pp. 129–141.*
Blake et al., D.C. Electromagnetic Scattering Simulations Using Overset Grids on Massively Parallel Computing Platforms, Antennas and Propagation Society International Symposium, IEEE, 1997, pp. 106–109, Jan. 1997.*
Barnard et al., S. Large–Scale Distributed Computational Fluid Dynamics on the Information Power Grid Using Globus, The Seventh Symposium on the Frontiers of Massively Parallel Computation, Frontier's '99, 1999, pp. 60–67, Jan. 1999.*
Biswas et al., R. Portable Parallel Programming for the Dynamic Load Balancing of Unstructured Grid Applications, 13th International and 10th Symposium on Parallel and Distributed Processing, 1999, IPPS/SPDP Proceedings, pp. 338–342, Jan. 1999.*
Minyard et al., T. Partitioning and Dynamic Load Balancing of Adaptive Hybrid Grids for Large–Scale Turbulent Flow Simulations, Proceedings of the 29th Hawaii International Conference on System Sciences, 1996, pp. 575–584, Jan. 1996.*
Van Driessche et al., R. Dynamic Load Balancing with an Improved Spectral Bisection Algorithm, Proceedings of the Scalable High–Performance Computing Conference, 1994, pp. 494–500, Aug. 1994.*
Daniel W. Barnette, *A User's Guide for Breakup: a Computer Code for Parallelizing the Overset Grid Approach*, Sandia National Laboratory SAND Report, Mar. 1998.
N. E. Suhs and R. W. Tramel, *Pegsus 4.0 User's Manual*, Nov. 1991, Final Report for Period Mar. 1, 1990 through Jun. 30, 1991, AEDC–TR–91–8.
S. E. Rogers, D. Kwak, C. Kiris, *Steady and Unsteady Solutions of the Incompressible Navier–Stokes Equations*, AIAA Journal, vol. 29, No. 4, Apr. 1991, pp. 603–610.

* cited by examiner

Primary Examiner—Russell Frejd
(74) Attorney, Agent, or Firm—V. Gerald Grafe; George H. Libman

(57) ABSTRACT

A multiprocessor computer overset grid method and apparatus comprises associating points in each overset grid with processors and using mapped interpolation transformations to communicate intermediate values between processors assigned base and target points of the interpolation transformations. The method allows a multiprocessor computer to operate with effective load balance on overset grid applications.

11 Claims, 20 Drawing Sheets

MULTIPROCESSOR COMPUTER OVERSET GRID METHOD AND APPARATUS

MULTIPROCESSOR COMPUTER OVERSET GRID METHOD AND APPARATUS

This invention was made with Government support under Contract DE-AC04-94AL85000 awarded by the U.S. Department of Energy. The Government has certain rights in the invention.

BACKGROUND OF THE INVENTION

This invention relates to the field of multiprocessor computer operation, specifically efficient operation of multiprocessor computers using overset grids.

The overset grid approach for computing field simulations around geometrically complex configurations has been widely used since its inception in the early 1970s. The overset grid approach is attractive because a complex geometry can be divided into its inherently simpler parts while maintaining the overall complex geometry. Each part can then be gridded separately, a less complicated process than gridding the entire complex geometry. The grid can be computationally re-combined in a solver to yield a smooth solution within and across each grid domain. The overset grid approach has continued to mature in the serial computing environment, for example, seeing use in well-known compressible and incompressible Navier-Stokes flow solvers.

An overset grid application typically begins with a background grid. The background grid can cover the whole problem space. Other grids covering portions of the problem space can also be defined. For example, a fine grid can be defined covering a portion of the problem space where higher resolution is desired. The background and other grids can each be called an "overset grid". FIG. 1 illustrates these concepts. Overset grid G1 encompasses a problem space and corresponds to simulation of phenomena throughout the problem space. Overset grid G2 encompasses a region of the problem space near object J where higher resolution simulation is required. Interpolation transformations (not shown) allow values from one overset grid (for example, G1) to be used to establish values in the other overset grid (for example, G2), assuring that the simulation is consistent across both overset grids G1, G2. Overset grid G2 allows high resolution where high resolution is required, while overset grid G1 allows low resolution (and consequently low execution time) where low resolution is acceptable.

In operation, a computer determines values for points in a first overset grid. Boundary conditions for a second overset grid can be determined by interpolating selected values from the first overset grid or from other overset grids. The computer then determines values for the other points in the second overset grid. Selected values from the second overset grid can then be used in interpolations to determine boundary conditions for other overset grids. The process can repeat until a terminal condition is reached, such as, for example, convergence of a simulation.

Overset grid applications are well-suited for problems where varying resolution or varying problem complexity indicate different grids. Unfortunately, overset grids have not fared well on multiprocessor computers. The wide range of possible overset grid sizes can lead to poor load balance, limiting the multiprocessor computer's performance. Also, communication and interpolation of boundary conditions can be problematic when overset grids are subdivided amongst multiple processors.

Accordingly, there is a need for a multiprocessor computer overset grid method and apparatus that maintains substantial load balance and efficient communication and interpolation of boundary conditions in overset grid applications.

SUMMARY OF THE INVENTION

The present invention provides a multiprocessor computer overset grid method and apparatus that maintains substantial load balance and efficient communication and interpolation of boundary conditions in overset grid applications. The present method comprises associating points in each overset grid with processors and using mapped interpolation transformations to communicate intermediate values between processors associated with base and target points of the interpolation transformations.

Each point in each overset grid is first associated with a processor. An initial overset grid is then selected, and values for points in the initial overset grid are determined (for example, by computational simulation of physical phenomena). A second overset grid is then selected. Values can then be determined for points in the second overset grid that are target points of interpolation transformations from base points in the initial overset grid. Values can then be determined for the remaining points in the second overset grid. The process can be repeated, using the second overset grid as the initial overset grid, until a terminal condition is reached.

Static load balance can be fostered in the association of overset grid points with processors. Each overset grid can have a certain number of points assigned to each of the processors, for example, each processor can be assigned a substantially equal number of points from each overset grid if the workload associated with the points is substantially similar. Each processor will consequently have substantially the same workload during operation, assuring effective load balance. Additionally, the points in each overset grid can be assigned to processors to maximize efficiency, for example, by minimizing the surface area to volume ratio of each processor's assigned points if communication costs are of concern.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

The present invention provides a multiprocessor computer overset grid method and apparatus that maintains substantial load balance and efficient communication and interpolation of boundary conditions in overset grid applications. The present method comprises associating points in each overset grid with processors and using mapped interpolation transformations to communicate intermediate values between processors assigned base and target points of the interpolation transformations.

Figure 1:
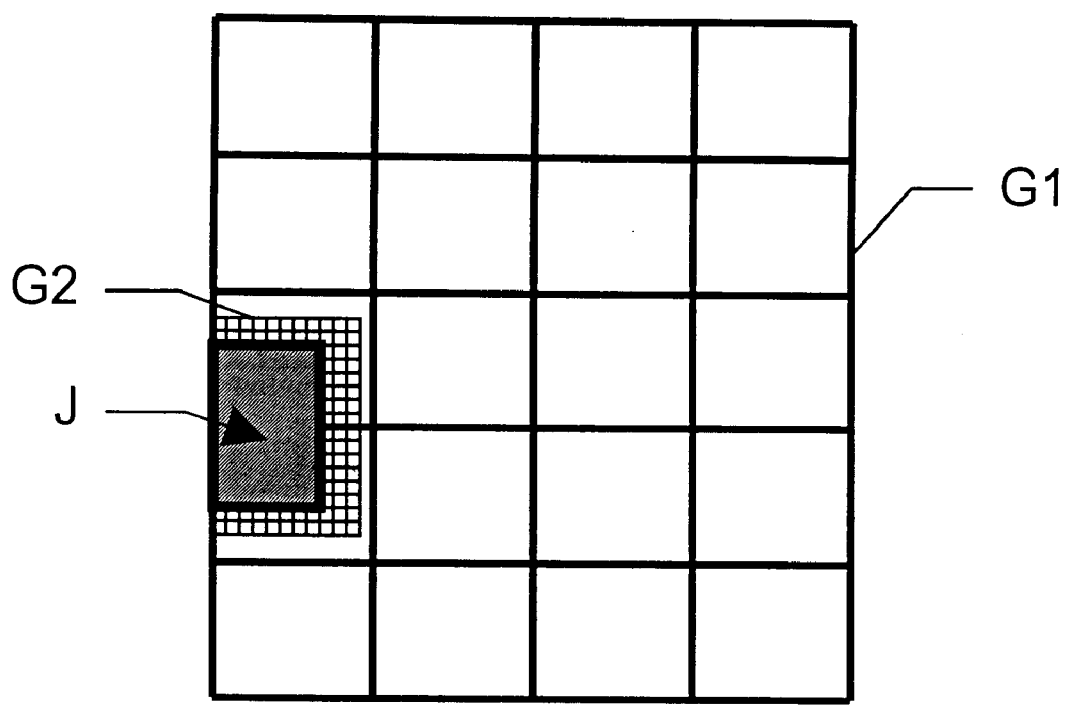
FIG. 1 is an illustration of an overset grid application.
Figure 2:
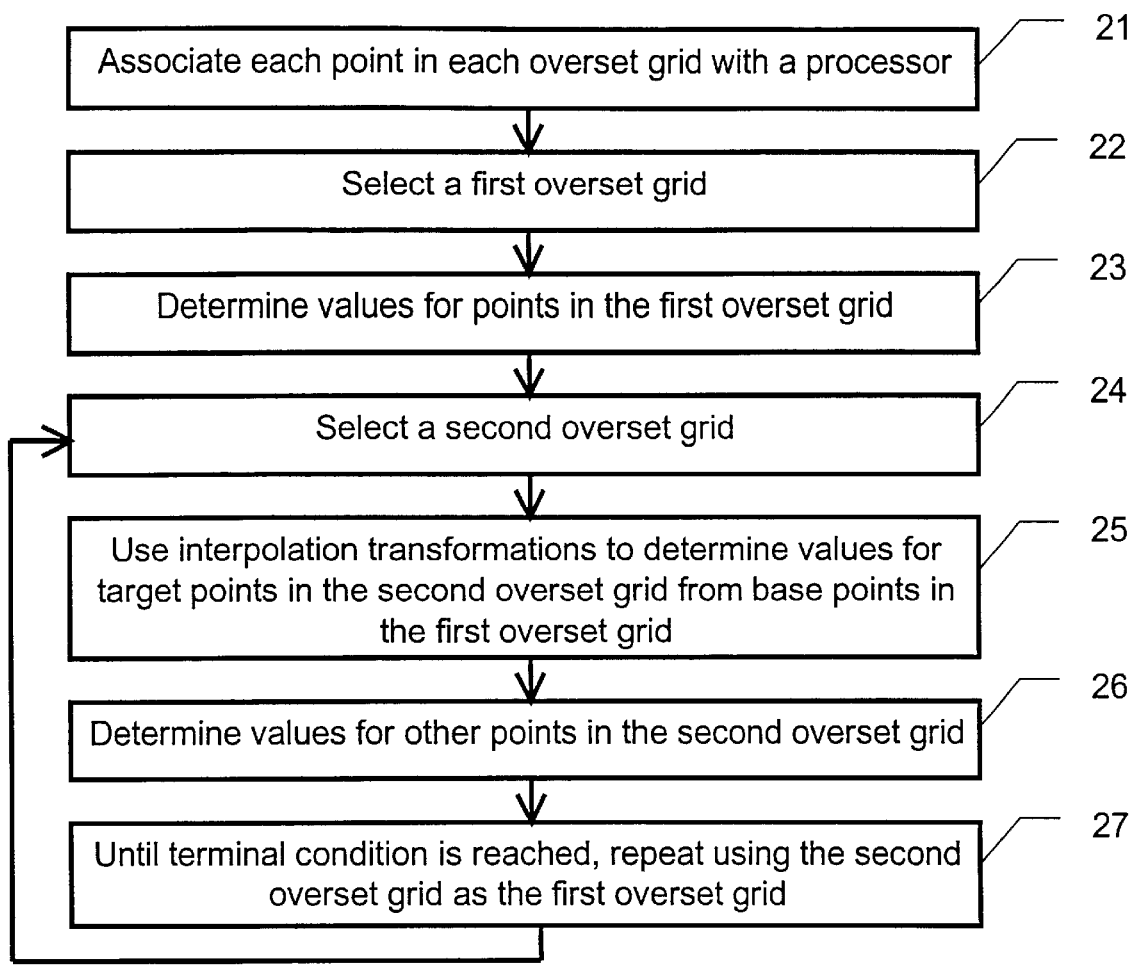
FIG. 2 is a flow diagram according to the present invention.

FIG. 2 is a flow diagram according to the present invention. Each point in each overset grid is associated with a processor 21. An initial overset grid is selected 22, and values for points in the initial overset grid determined 23. For example, values can be determined by computational simulation of a physical process. A second overset grid is then selected 24. Interpolation transformations from base points in the initial overset grid to target points in the second overset grid can be used to determine values for the target points in the second overset grid 25. Values can then be determined for the remaining points in the second overset grid 26. For example, values can be determined for the remaining points by computation simulation of a physical process using values at the target points as boundary conditions. The process can be repeated, using the second overset grid as the initial overset grid, until a terminal condition is reached 27. For example, the process can be repeated for a selected number of timesteps, or until the values in the overset grids assume some selected characteristics.

Figure 3:
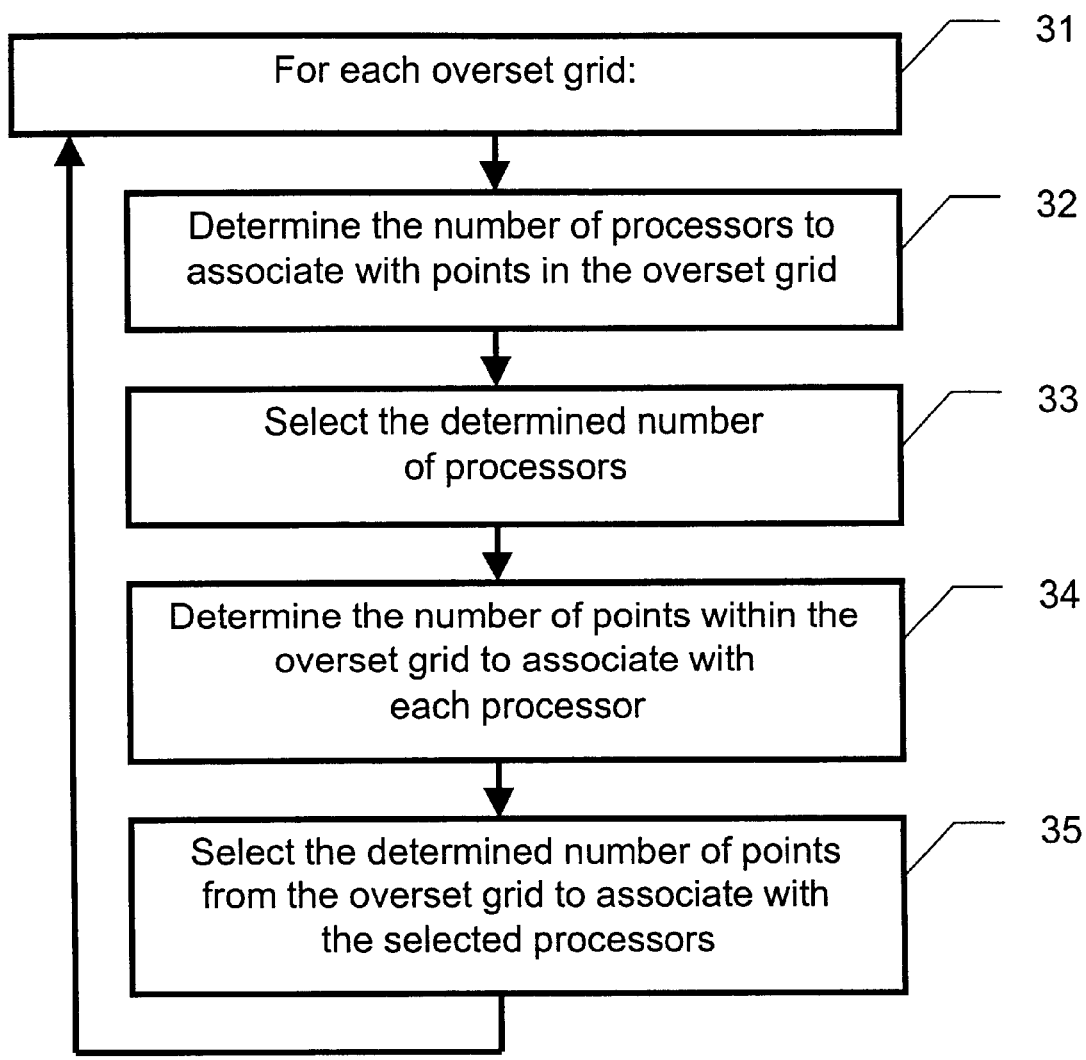
FIG. 3 is a flow diagram according to the present invention.

FIG. 3 is a flow diagram of the association of points with processors. The points in each overset grid 31 are associated with processors. A number of processors to associate with an overset grid can be determined 32. All the processors can be associated with each overset grid. Alternatively, each overset grid can be associated with a subset of the processors. If less than all the processors are to be associated with the overset grid, then the determined number of processors is selected 33. Next, the number of points within the overset grid to associate with each of the selected processors can be determined 34. Where the workload per point is substantially equal, the number of points can be chosen so that number of associated points is substantially uniform across the selected processors. If the workload per point varies, the number of points can be chosen so that the workload across the selected processors will be substantially uniform. Similarly, if the processors capabilities vary, the number of points can be chosen so that execution time will be substantially uniform.

The determined number of points can then be selected from the overset grid for association with each processor 35. Selection of points can be accomplished in various ways. For example, points can be selected in a variety of randomly-dimensioned cubic subdomains. If the application has communication locality, and the multiprocessor can exploit communication locality, then points can be selected so that each processor has points associated therewith defining a subgrid of the overset grid. Communication efficiency can then be maximized by minimizing the surface area to volume ratio of the subgrids. The association of overset grid points with processors is accomplished for each of the overset grids in the overset grid application.

Figure 4:
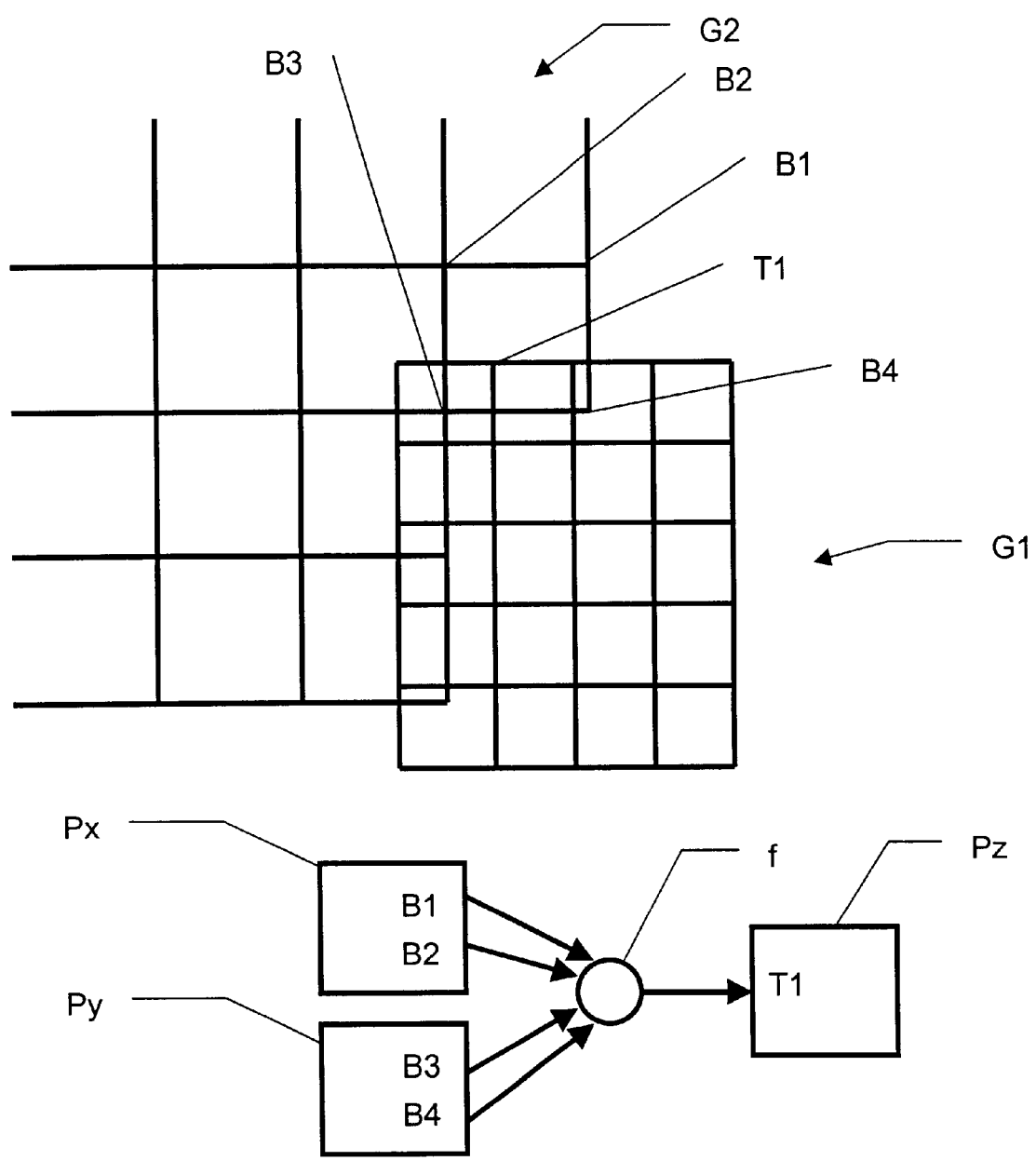
FIG. 4 is an illustration of mapping of interpolation transformations, base points, and target points.

The association of overset grid points with processors also determines mapping of interpolation transformations. FIG. 4 shows an example of interpolation transformation mapping according to the present invention. Interpolation transformation f accepts values for base points B1, B2, B3, and B4 in overset grid G2 as inputs and yields a value for target point T1 in overset grid G1. Base points B1 and B2 from overset grid G2 are associated with processor Px. Base points B3 and B4 from overset grid G2 are associated with processor Py. Target point T1 in overset grid G1 is associated with processor Pz.

After values for points (including points B1, B2, B3, and B4) in overset grid G2 are determined, interpolation transformation f can be used to determine a value for target point T1 in overset grid G1. Interpolation transformation f must be mapped to allow communication with processors Px, Py (associated with its base points), and with processor Pz (associated with its target point). This can be done by establishing communication paths from processors Px, Py to processor Pz, and allowing processor Pz to process interpolation transformation f. Alternatively, a communication path can be established from processor Px to processor Py and allowing processor Py to process interpolation transformation f. A second communication path can then allow processor Py to communicate the value determined for target point T1 to processor Pz. Those skilled in the art will appreciate various other suitable mapping arrangements.

Information identifying processors associated with neighboring points in the same overset grid (where inter-processor communication can be required to solve a single overset grid) and points related by interpolation transformations (where inter-processor communication can be required to solve successive overset grids) can be maintained in a connectivity table accessible to each processor. A single global connectivity table can be maintained, although efficiency can suffer on distributed memory multiprocessors. On distributed memory multiprocessors, only those parts of the connectivity table required by the points associated with a given processor need be kept local to the processor. Accessing required information from the connectivity table accordingly can be a strictly local access, increasing the overall efficiency of the multiprocessor.

EXAMPLE IMPLEMENTATION

The method of the present invention was applied to overset grid applications in a software implementation known as "BREAKUP", described in "A User's Guide for Breakup: A Computer Code for Parallelizing the Overset Grid Approach," Barnette, Sandia National Laboratories SAND98-0701, April 1998, incorporated herein by reference. Details of the BREAKUP implementation are presented below, followed by sample results.

Overview

Figure 5:
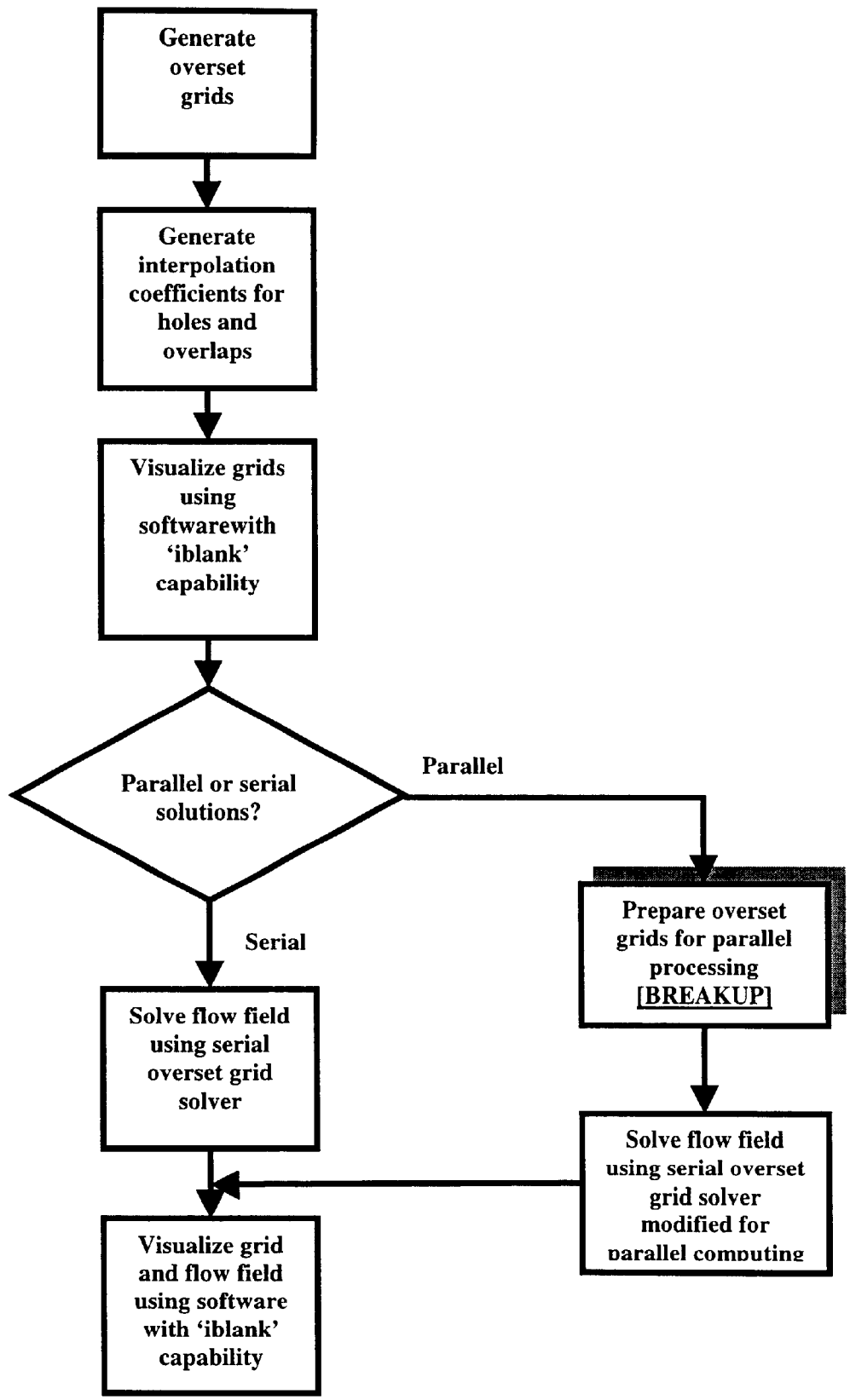
FIG. 5 is a flow diagram according to the present invention.

An overview flow chart for the BREAKUP parallel overset grid method is presented in FIG. 5. The flow chart illustrates that the method was designed to minimally impact the serial overset grid approach. The serial-to-parallel modifications needed to implement the approach involve the requirement that the grids need additional preparation for the parallel solver, and that the solver must be modified via message passing calls for use on a parallel computer. The method currently implemented is such that all codes, including BREAKUP, visualization codes, and pre- and post-processing codes, run on a workstation. The solver, of course, is run on a multiprocessor computer.

Overset Grid-to-Overset Grid Communications

Overset grids require the capability to communicate with overlapped or embedded grids. In the example implementation, PEGSUS 4.0, described by Suhs and Tramel in "PEGSUS 4.0 User's Manual," AEDC-TR-91-8, Calspan Corporation/AEDC Operations, Arnold AFB, Tennessee, USA, incorporated herein by reference, was used to generate interpolation coefficients for grid-to-grid communications where separate grids overlap. Solvers that are PEGSUS-based use the interpolation coefficients and data from other influencing grids to update boundary conditions in overlapped regions on each grid as the governing equations are solved. Other codes exist to generate the interpolation coefficients. However, BREAKUP was configured to read the output of PEGSUS only.

Parallel Overset Grid Construction

Figure 6:
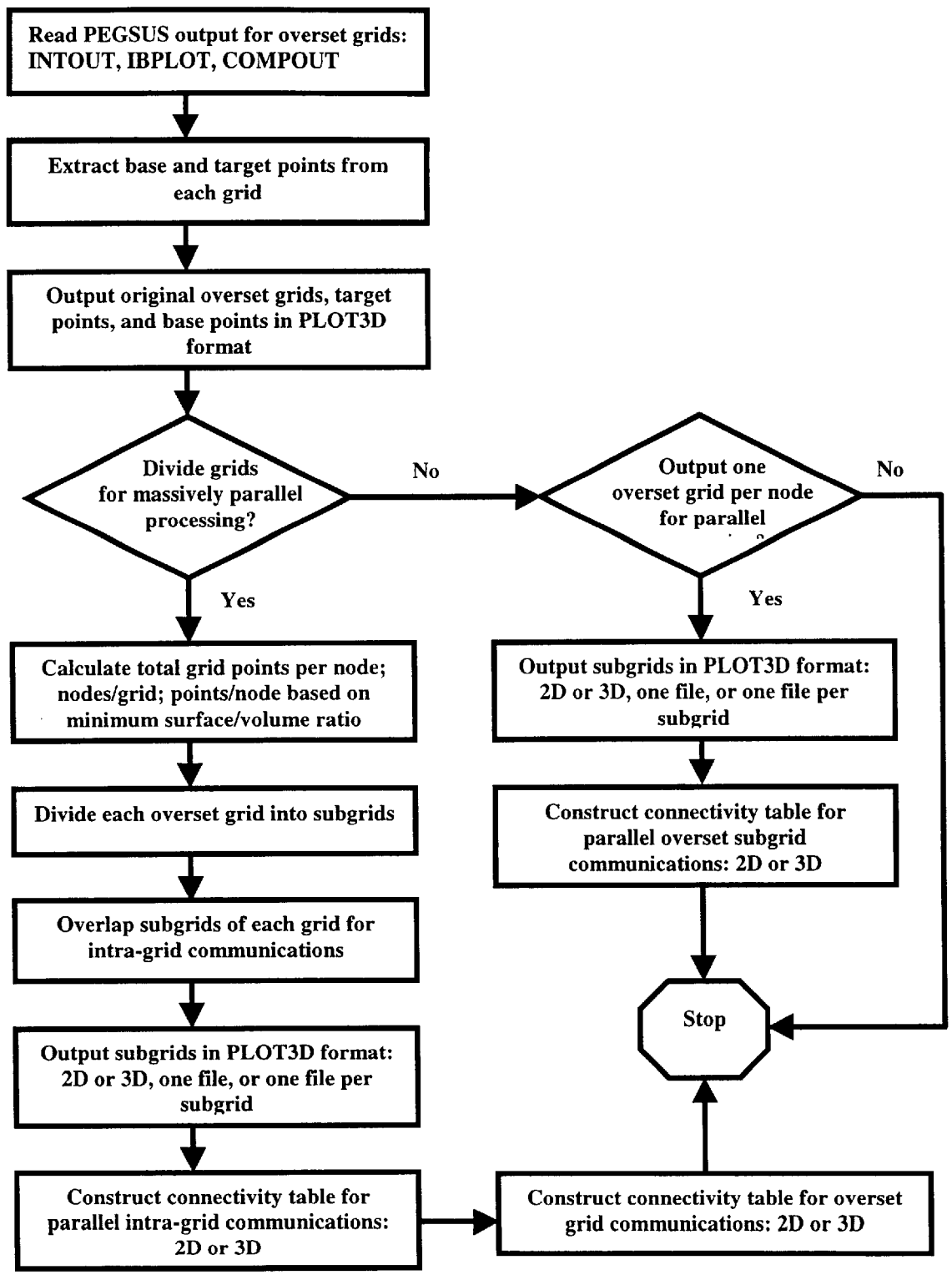
FIG. 6 is a flow diagram according to the present invention.

BREAKUP may be considered as a preprocessor to PEGSUS-based parallel solvers and, as such, represents the cornerstone to the parallel overset grid approach. An overview flow chart of BREAKUP is presented in FIG. 6. The primary purpose of BREAKUP is to prepare the output of PEGSUS for parallel computing. PEGSUS output includes the overset (known as composite in PEGSUS jargon) grids, the iblank array that flags grid points for special handling in the solver, and an interpolation coefficient file used for grid-to-grid communication. BREAKUP divides each overset grid into subgrids corresponding to the user-specified number of processors in a multiprocessor computer system (including heterogeneous multiprocessors, homogenous multiprocessors, and distributed computing environments). BREAKUP computes the total number of grid points, computes the average number of grid points per processor, and divides each grid into subgrids such that a near-uniform distribution of grid points exists on each processor. Separate overset grids are divided such that the grid's perimeter-to-area ratio in 2-D, or surface-to-volume ratio in 3-D, is minimized. The subgrids are assigned to individual processors in a sequential manner with no regard to optimal communication paths between adjacent processors. This means that in the BREAKUP implementation of the present invention there is no guarantee that two subgrids from different overset grids requiring high communications costs will lie adjacent or even close to each other to minimize latency. Such capabilities could be added, however. Breakup also constructs connectivity tables for intra-grid and overset grid communications.

Figure 7:
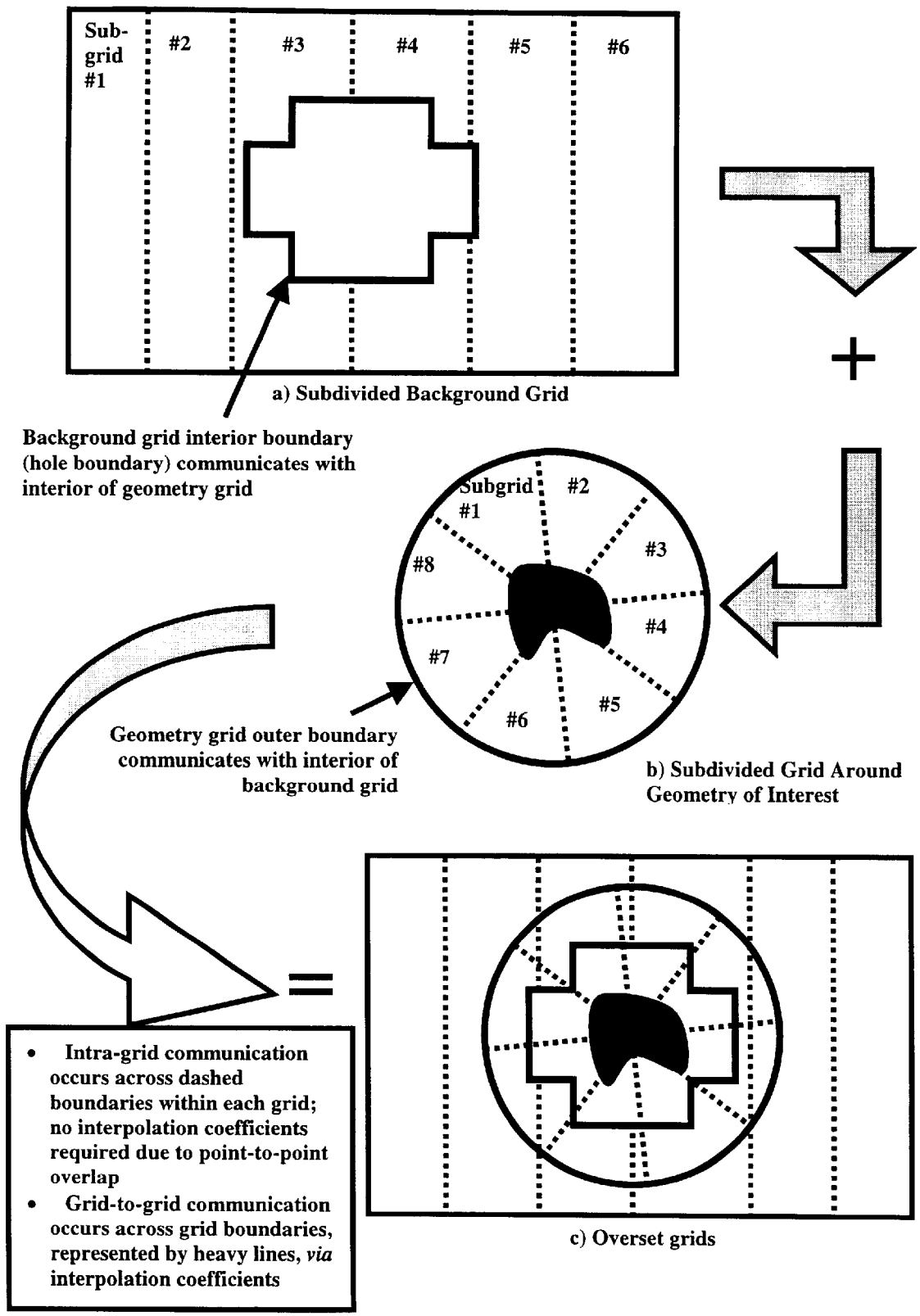
FIG. 7 is an illustration of message passing between processors.

Dividing the overset grids into subgrids results in a significant amount of message passing between processors, as illustrated in FIG. 7. This is due to the necessity for grid-to-grid communications as well as intra-grid communication. Intra-grid communication is defined as message passing between subgrids of a unique overset grid. Grid-to-grid communication is defined as message passing between subgrids of separate overset grids. For grid-to-grid communications, the additional boundaries resulting from forming subgrids requires appropriate interpolation coefficients corresponding to each new subgrid. The interpolation coefficients are the same as those computed by the PEGSUS code. BREAKUP searches the PEGSUS coefficients and correlates them to the appropriate subgrids.

As mentioned above, intra-grid communication results from overlapping subgrids of an individual, unique overset grid. Adjacent subgrids align point-to-point by definition and, therefore, require no interpolation coefficients. However, the solver must know where to send and receive boundary information for intra-grid, as well as grid-to-grid, communications. BREAKUP constructs connectivity tables for both grid-to-grid and intra-grid communications such that each processor has the correct data to update its subgrid. The table for grid-to-grid communications contains the processor location of each pair of interpolation coefficients and those points on other processors (i.e., subgrids) which require the coefficients. The solver must be modified to use the tables to update grid boundary data. More detail regarding connectivity tables is given below.

Load Balance

Load balancing on parallel processors means that each processor should have the same, or nearly the same, work. In practice, this can be difficult to achieve since the size of individual overset grids can significantly vary in any given problem.

The approach to load-balancing subgrids in BREAKUP is as follows. First, BREAKUP determines the total number of grid points in all grids and divides by the number of user-specified subgrids (or processors) required. This gives the average number of grid points per processor. Next, the number of grid points in each individual overset grid is divided by this number to give the total number of processors that will be dedicated to that grid. Of course, this number seldom, if ever, is a whole number. BREAKUP is programmed to sequentially enlarge subgrid boundaries within the said grid to encompass more grid points that remain after calculating the number of processors per grid. This process ensures that the subgrid boundaries remain flexible enough to encompass all grid points. Also, it keeps the impact on load balancing to a minimum while keeping fixed the number of processors assigned to that grid.

If it happens that many grid points are left over, it becomes possible to better load balance the original grids with a larger number of processors. In this case, the code outputs a message to the effect that the grids cannot be optimally subdivided on the specified number of processors. BREAKUP then calculates the nearest number of processors over which the grids would be better load balanced. The user is then queried to either input a new value for the number of processors required or accept the new number and continue.

It is possible that BREAKUP will be given a small enough grid that cannot be subdivided. In this case, BREAKUP will leave the small grid intact. The premise is that, if there are only a few, these relatively small grids will not have a significant impact on the load balancing of the entire set of overset grids. That is, only a few processors with very small grids will have to wait on the many other processors to finish a solution time step.

Speed-Up

Speed-up occurs by minimizing communications between subgrids and maximizing the computational work performed on each processor. Communication occurs at the grid boundaries and hence is proportional to the grid's surface area. Computational work is performed at each grid point and is therefore proportional to the grid volume. Hence, it is advantageous when subdividing the grid to minimize its surface area and maximize its volume. Once the number of processors assigned to each overset grid is known, BREAKUP determines all the 3-factors of that number and finds the minimum value of the ratio of subgrid surface area to volume.

Sample Breakup Output

An example of how BREAKUP handles load-balancing and speed-up will illustrate the process. Assume a user has the six grids shown in Table 1, with the grid size indicated by j, k, and l. Each grid has the total number of points listed.

TABLE 1

| Grid # | j | k | l | Total Points |
|---|---|---|---|---|
| 1 | 3 | 77 | 53 | 12243 |
| 2 | 3 | 249 | 20 | 14940 |
| 3 | 3 | 240 | 20 | 14400 |
| 4 | 3 | 135 | 20 | 8100 |
| 5 | 3 | 234 | 20 | 14040 |
| 6 | 3 | 133 | 20 | 7980 |

The total number of grid points is 71,703. If the user chooses to subdivide these grids into 16 subgrids, the average number of points per processor (rounded to the nearest integer) is 4,481. Dividing the number of grid points for each grid by the average number of gridpoints desired on each processor yields the information in Table 2.

TABLE 2

| Grid # | Total points in grid | Average number of grid points per processor | Number of processors for each grid |
|---|---|---|---|
| 1 | 12243 | 4481 | 3 |
| 2 | 14940 | 4481 | 3 |
| 3 | 14400 | 4481 | 3 |
| 4 | 8100 | 4481 | 2 |
| 5 | 14040 | 4481 | 3 |
| 6 | 7980 | 4481 | 2 |

BREAKUP calculates that three processors will be assigned to Grid #1, three to Grid #2, and so on. This implies, of course, that Grid #1 will be divided into three subgrids, Grid #2 into three subgrids, etc. Although this simple calculation informs the user how many subgrids will be formed from each original overset grid, it does not indicate how the subgrids will be formed. To do this, BREAKUP examines all of the three-factors that can be determined from the number of processors assigned for each grid. For Grid #1, BREAKUP determines that the original grid can be subdivided shown in Table 3.

TABLE 3

| ITAG | J | K | L |
|---|---|---|---|
| 1 | 1 | 1 | 3 |
| 2 | 1 | 3 | 1 |
| 3 | 3 | 1 | 1 |

The ITAG parameter is for reference only. The row-wise product of the three-factors listed under the J, K, and L columns is always equal to the number of processors assigned to Grid #1. Here, J, K, and L are assumed to be oriented in the grid's j, k, and l direction, respectively, and represent the maximum indices that will be assigned to the subgrids. For example, Grid #1 can be subdivided into 1 subgrid in the grid's own j direction, 1 subgrid in its k direction, and 3 subgrids in its l direction. Any permutation of this can also be made. However, the permutation desired is the one that will yield a minimum surface area for each subgrid and a maximum grid volume. Therefore, each combination of three-factors, associated with increasing values of ITAG, must be examined to give the minimum ratio of subgrid area over subgrid volume.

The surface area of any one subgrid for Grid #1 may be written as in equation 1.

$$\text{surf} = 2\left[\frac{j\max}{J} \times \frac{k\max}{K} \times \frac{k\max}{K} \times \frac{l\max}{L} \times \frac{j\max}{J} \times \frac{l\max}{L}\right] \quad \text{equation 1}$$

In equation 1, j max, k max, and l max are the dimensions of the original overset grid 1, and J, K, and L are the number of subgrids into which the grid will be subdivided in their respective directions. Hence, the quantity j max/J will denote the dimension, or number of grid points, of one subgrid in the j direction. Note that J, K, and L can take on any permutation of the three-factors listed above. The volume of any of the subgrids is given by equation 2.

$$\text{vol} = \frac{j\max}{J} \times \frac{k\max}{K} \times \frac{l\max}{L} \quad \text{equation 2}$$

The area-to-volume ratio is given by equation 3.

$$\frac{\text{surf}}{\text{vol}} = 2\left[\frac{J}{j\max} \times \frac{K}{k\max} \times \frac{L}{l\max}\right] \quad \text{equation 3}$$

This ratio is to be minimized to achieve the most efficient configuration for subdividing the original grid. Minimization occurs by substituting the various three-factors for J, K, and L associated with the variable ITAG. The ratio is calculated for each permutation. The combination that gives the minimum ratio is selected as the way to subdivide the grid. For Grid #1, BREAKUP calculates the ratios in Table 4 for each ITAG three-factors.

TABLE 4

| ITAG | surf/vol | min(surf/vol) |
|---|---|---|
| 1 | 0.805848 | 0.805848 |
| 2 | 0.782325 | 0.782325 |
| 3 | 2.063710 | 0.782325 |

Once the particular three-factor is determined that yields the minimum surface-to-volume ratio, then the grid points in the directions corresponding to the appropriate ITAG value chosen above are divided by the appropriate J, K, or L value to give the approximate number of points per subgrid in each direction after selecting the ITAG=2 permutation. BREAKUP'S output for this is shown in Table 5.

TABLE 5

N/Jmax = 1/3 ==> approx. 3 pts/subgrid in J direction
M/Kmax = 3/77 ==> approx. 26 pts/subgrid in K direction
P/Lmax = 1/53 ==> approx. 53 pts/subgrid in L direction In Table 5 N, M, and P are used to denote the permuted J, K, and L values for ITAG=2. Note that 26 points per subgrid in the K direction for three subgrids will leave one point too many in that direction. BREAKUP handles this as indicated by the output in Table 6.

Warning: Kmaxx/M not evenly divisible! K-remainder=1
BREAKUP will make adjustments in the size of the subgrids to compensate for the above remainders. Adjustments will start at the boundaries and progress inward. Hence, when remainders appear, outer subgrids will have their dimensions increased in the corresponding direction.

TABLE 6

Final subgrid dimensions are:

| Grid# | Jcube | Kcube | Lcube | Jmax | Kmax | Lmax | Total |
|---|---|---|---|---|---|---|---|
| 1 | 1 | 1 | 1 | 3 | 27 | 53 | 4293 |
| 2 | 1 | 2 | 1 | 3 | 26 | 53 | 4134 |
| 3 | 1 | 3 | 1 | 3 | 26 | 53 | 4134 |

The values for Jcube, Kcube, and Lcube denote the indices given to each subgrid. The values listed for Jmax, Kmax, and Lmax denote the number of points in the corresponding subgrid along each of its sides. Finally, the total number of grid points for each subgrid in Grid #1 is listed in the Total column. The totals include grid points on common and overlapped faces between subgrids. It can be seen the values are within approximately 8% of the average number of grid points per processor value of 4,481 set forth in Table 2.

To ensure accuracy, BREAKUP calculates the total number of grid points in all of the subgrids, subtracts the grid points in the common or overlapped regions that were formed as indicated above, and compares the final number with the total number of grid points originally computed for the overset grid. The user is notified if any discrepancies exist. In the present example, the number computed from subgrids and the original number match, as they should.

The above process is repeated for each overset grid. If the user has input PEGSUS-generated interpolation coefficients, BREAKUP will correlate the original coefficients with the new subgrids for constructing the connectivity tables, discussed below.

Note that the best speed-up in the above sense would be to have the maximum number of grid points in the maximum amount of memory allowed on processors having identical amounts of memory. This may be a realistic expectation for homogeneous compute clusters or massively parallel machines. It is not realistic for heterogeneous compute clusters. Due to possibly widely varying processors, cache, memory, bandwidth, etc., heterogeneous clusters present a significant challenge to any code attempting to achieve a high degree of parallelism. BREAKUP currently does not account for variance of any hardware limitations when subdividing grids.

Construction of Connectivity Tables

Connectivity tables are needed by the solver to determine which processors need to send information to which receiving processors and vice versa. These tables contain information to be used for passing information from processor to processor. Shown below are partial sample outputs for connectivity tables as generated by BREAKUP. Two tables are constructed. One is generated for intra-grid communications; the other, for grid-to-grid communications. The table for intra-grid communications will be discussed first.

A sample connectivity table for intra-grid communications is listed in Table 7. The first column indicates the appropriate subgrid under attention. The remaining part of the row lists the subgrid range of indices from which messages will be sent. The next row indicates the subgrid and subgrid indices that will receive information from the processor indicated in the line immediately above it. Hence, each pair of rows indicates a subgrid and its boundaries from which data will be sent, and which subgrid and boundary will receive the data. For example, subgrid 1 will communicate with subgrid 2, as indicated in the first two rows of numbers. The next two rows indicate subgrid 2 will communicate with subgrid 3. Next, it is indicated that subgrid 2 will also communicate with subgrid 1, subgrid 3 with subgrid 2, and subgrid 4 with subgrid 5.

TABLE 7

| cZone# | Jbeg | Jend | Jinc | Kbeg | Kend | Kinc | Lbeg | Lend | Linc |
|---|---|---|---|---|---|---|---|---|---|
| 1 | 1 | 3 | 1 | 27 | 27 | 1 | 1 | 53 | 1 |
| 2 | 1 | 3 | 1 | 2 | 2 | 1 | 1 | 53 | 1 |
| 2 | 1 | 3 | 1 | 28 | 28 | 1 | 1 | 53 | 1 |
| 3 | 1 | 3 | 1 | 2 | 2 | 1 | 1 | 53 | 1 |
| 2 | 1 | 3 | 1 | 1 | 1 | 1 | 1 | 53 | 1 |
| 1 | 1 | 3 | 1 | 26 | 26 | 1 | 1 | 53 | 1 |
| 3 | 1 | 3 | 1 | 1 | 1 | 1 | 1 | 53 | 1 |
| 2 | 1 | 3 | 1 | 27 | 27 | 1 | 1 | 53 | 1 |
| 4 | 1 | 3 | 1 | 85 | 85 | 1 | 1 | 20 | 1 |
| 5 | 1 | 3 | 1 | 2 | 2 | 1 | 1 | 20 | 1 |

A sample connectivity table for grid-to-grid communications is presented in Table 8. The first line indicates the number of points (477) in subgrid #1 whose data need to be sent to other subgrids. The subsequent columns list the three indices (1,22,43) of the grid point in the donor subgrids #1, the three interpolation coefficients needed to compute the data needed, the processor number (#4) to which data will be sent, and the three indices (1,76,20) of the point in the recipient subgrids at which the dependent variables will be interpolated. The first few lines for donor subgrids #2 are shown for continuity. The solver uses these tables to send and receive messages for updating subgrid boundaries.

TABLE 8

| | | | 477 Base subzone #1 | | | | | | |
|---|---|---|---|---|---|---|---|---|---|
| 1 | 22 | 43 | 0.0000000E+00 | 6.2530622E−02 | 3.8906133E−01 | 4 | 1 | 76 | 20 |
| 1 | 22 | 43 | 0.0000000E+00 | 2.5979275E−01 | 4.2713684E−01 | 4 | 1 | 73 | 20 |
| 1 | 21 | 43 | 1.0000000E+00 | 8.2356793E−01 | 2.7348068E−01 | 4 | 2 | 79 | 20 |
| 2 | 21 | 43 | 1.0000000E+00 | 9.1715431E−01 | 3.2546192E−01 | 4 | 3 | 78 | 20 |
| | | | 1035 Base subzone #2 | | | | | | |
| 1 | 15 | 46 | 0.0000000E+00 | 2.9964754E−01 | 9.7948408E−01 | 4 | 1 | 12 | 20 |
| 1 | 6 | 35 | 1.0000000E+00 | 2.9722536E−01 | 6.7863387E−01 | 4 | 2 | 28 | 20 |
| 1 | 15 | 48 | 0.0000000E+00 | 5.0462323E−01 | 9.6113777E−01 | 4 | 1 | 5 | 20 |
| 2 | 16 | 49 | 1.0000000E+00 | 5.2282799E−01 | 3.2107067E−01 | 4 | 3 | 2 | 20 |

BREAKUP has been modularly constructed to perform the task of preparing multiple overset grids for parallel processing. This allows the user to more easily run and, if necessary, modify the code. A calling tree of BREAKUP's subroutines is presented in Table 9.

TABLE 9

| | |
|---|---|
| main | chooser |
| base_search | average |
| get_zone | break (see above) |
| breakup_for_fun | link_overlap |
| average | patch_2d |
| break | link_overset |
| get_global_index | decimate |
| global_indices | get_global_index |
| grid_point_comparison | get_zone |
| min_surf_vol_ratio | sort |
| out1planetoplt3d_break | index |
| get_global_index | nobreak |
| read_zone | decimate |
| read_zone_header | get_zone |
| out1planetoproc_break | out1planetoplt3d_nobreak |
| get_global_index | read_zone |
| read_ibplot | read_zone_header |
| read_intout | out1planetoproc_nobreak |
| read_zone | read_ibplot |
| read_zone_header | read_intout |
| outallplanestoplt3d_break | read_zone |
| get_global_index | read_zone_header |
| read_zone | outallplanestoplt3d_nobreak |
| read_zone_header | read_zone |
| outallplanestoproc_break | read_zone_header |
| get_global_index | outallplanestoproc_nobreak |
| read_ibplot | read_ibplot |
| read_intout | read_intout |
| read_zone | read_zone |
| read_zone_header | read_zone_header |
| subgrid_dimensions | read_zone |
| write_subgrids | read_zone_header |
| get_global_index | sort (see above) |
| global_indices | footer |
| grid_point_comparison | fdate |
| min_surf_vol_ratio | header |
| read_grid_header | fdate |
| subgrid_dimensions | read_compout |
| write_subgrids (see above) | read_ibplot |
| breakup_grids | write_grids |
| average | read_intout |
| break (see above) | target_search |
| read_grid_header | get_zone |
| (continued next column) | write_base_target_points |
| | write_unravel |

Descriptions of Breakup Subroutines average: takes in all grids and computes average number of grid points per grid.
Calling routines: breakup_for_fun, breakup_grids, chooser.
Called routines, in order of appearance: none.

base_search: searches for base points for overset Chimera-type grids.
Calling routines: main.
Called routines, in order of appearance: get_zone, get_zone.

break: breaks up grids into a user-specified number of zones.
Calling routines: breakup_for_fun, breakup_grids, chooser.
Called routines, in order of appearance: min_surf_vol_ratio, subgrid_dimensions, grid_point_comparison, global_indices, get_global_index, write_subgrids, get_global_index, write_subgrids, out1planetoproc_break, outallplanestoproc_break, out1planetoplt3d_break, outallplanestoplt3d_break.

breakup_for_fun: main calling code for breaking up grids without PEGSUS interpolation coefficients and without enforcing overlapped regions.
Calling routines: main.
Called routines, in order of appearance: min_surf_vol_ratio, subgrid_dimensions, grid_point_comparison, global_indices, write_subgrids, read_grid_header, average, break.

breakup_grids: main calling code for breaking up grids without PEGSUS interpolation coefficients; overlapped regions are generated between subgrids.
Calling routines: main.
Called routines, in order of appearance: read_grid_header, average, break.

chooser: gives the user the option to break up grids for parallel processing.
Calling routines: main.
Called routines, in order of appearance: average, break, link_overlap, link_overset, nobreak.

decimate: reads data from file >3D_OVERSET_TABLE< (unit 15) and constructs file >2D_OVERSET_TABLE< by searching on the target jkl's from file >3D_OVERSET_TABLE< and extracting only those with a to-be-calculated target index.
Calling routines: link_overset, nobreak.
Called routines, in order of appearance: none.

footer: signs off.
Calling routines: main.
Called routines, in order of appearance: fdate.

get_global_index: gives the index range for subgrids using global indices. It is called from various locations throughout the code.
Calling routines: break, link_overset, out1planetoplt3d_break, out1planetoproc_break, outallplanestoplt3d_break, outallplanestoproc_break, write_subgrids.
Called routines, in order of appearance: none.

get_zone: reads in the proper zone 'nz' from the grid file in any order.
Calling routines: base_search, link_overset, nobreak, target_search.
Called routines, in order of appearance: none.

global_indices: sets up the global indices needed to break up the zone. Call this routine after calling subroutine subgrid_dimensions.
Calling routines: break, breakup_for_fun.
Called routines, in order of appearance: none.

grid_point_comparison: calculates the total number of points for the original grid, and the total number of grid points for the subgrids of the original grid, and compares the two. The program stops if there is a difference. This is to provide some error checking.
Calling routines: break, breakup_for_fun.
Called routines, in order of appearance: none.

header: prints out the header for output.
Calling routines: main.
Called routines, in order of appearance: fdate.

indexx: indexes an array iarr(1:n), ie., outputs the array indx(1:n) such that iarr(indx(j)) is in ascending order for j=1,2,...,N. The input quantities n and iarr are not changed.
Calling routines: sort.
Called routines, in order of appearance: none.

info: lists variables of interest, filenames, etc., to aid the user in understanding the program.
Calling routines: none.
Called routines, in order of appearance: none.

link_overlap: links overlapped (patched) subgrids in a zone. This subroutine is not called for overlapped regions for which interpolation coefficients have been generated. The subgrids are assumed to align point-to-point.
Calling routines: chooser.
Called routines, in order of appearance: write_unravel, patch_2d.

link_overset: links grid subgrids for overlapped embedded grids.
Calling routines: chooser.
Called routines, in order of appearance: get_zone, get_global_index, get_global_index, get_zone, sort, decimate.

min_surf_vol_ratio: calculates the 3-factors for a given number of subgrids, then calculates the surface to volume ratio for each set of 3-factors given the maximum j,k,l dimensions of each grid.
Calling routines: break, breakup_for_fun.
Called routines, in order of appearance: none.

nobreak: keeps all grids as was output by the PEGSUS code. File 3D_OVERSET_TABLE is generated listing all base and target grid points. Grids are output as one file or as multiple files, user choice. Essentially, output is for running a flow solver on a serial machine or for distributed computing, not for massively parallel applications on concurrent processors.
Calling routines: chooser.
Called routines, in order of appearance: read_zone_header, read_zone, out1planetoproc_nobreak, outallplanestoproc_nobreak, out1planetoplt3d_nobreak, outallplanestoplt3d_nobreak, get_zone, sort, decimate.

out1planetoplt3d_break: writes one plane of each subgrid to file GRIDS (UNIT 20) in PLOT3D format for graphics.
Calling routines: break.
Called routines, in order of appearance: read_zone_header, read_zone, get_global_index, get_global_index, get_global_index.

out1planetoplt3d_nobreak: writes one plane of each of the original grids to file GRIDS2D (UNIT 20) in PLOT3D format for graphics.
Calling routines: nobreak.
Called routines, in order of appearance: read_zone_header, read_zone.

out1planetoproc_break: outputs one plane of data for each processor on a massively parallel computer. Output is to file 2Dx.FMT, where x is 0000, 0001, 0002, etc.
Calling routines: break.
Called routines, in order of appearance: read_zone_header, read_zone, read_intout, read_ibplot, get_global_index, get_global_index, get_global_index.

out1planetoproc_nobreak: outputs one plane of data for each processor on a massively parallel computer. Output is to file 2Dx.FMT, where x is 000, 001, 002, etc.
Calling routines: nobreak.
Called routines, in order of appearance: read_zone_header, read_zone, read_intout, read_ibplot.

outallplanestoplt3d_break: writes all planes of each subgrid to file GRIDS3D (UNIT 20) in PLOT3D format for graphics.
Calling routines: break.
Called routines, in order of appearance: read_zone_header, read_zone, get_global_index.

outallplanestoplt3d_nobreak: writes all planes of each subgrid to file GRIDS3D (UNIT 20) in PLOT3D format for graphics.
Calling routines: nobreak
Called routines, in order of appearance: read_zone_header, read_zone.

outallplanestoproc_break: outputs all planes of data for each processor on a massively parallel computer. Output is to file 3Dx.FMT, where x is 0000, 0001, 0002, etc.
Calling routines: break.
Called routines, in order of appearance: read_zone_header, read_zone, read_intout, read_ibplot, get_global_index.

outallplanestoproc_nobreak: outputs all planes of data for each processor on a massively parallel computer. Output is to file XYx.FMT, where x is 0000, 0001, 0002, etc.
Calling routines: nobreak
Called routines, in order of appearance: read_zone_header, read_zone, read_intout, read_ibplot.

patch_2d: reduces the table of 3D patched, i.e. point-to-point overlapped grids, to a 2D table for 2D flow solvers.
Calling routines: link_overlap.
Called routines, in order of appearance: none.

read_compout: reads data from file COMPOUT, as generated by PEGSUS code.
Calling routines: main.
Called routines, in order of appearance: read_ibplot, write_grids.

read_gridheader: attempts to find the grid file, a plot3d 3D type file, and determines whether it is formatted or unformatted, single or multiple zone, and with or without an blank array. It reads in the dimensions of the grid and performs parameter checks, and leaves the grid file opened with the pointer after the records containing the dimensions.
Calling routines: breakup_for_fun, breakup_grids.
Called routines, in order of appearance: none.

read_ibplot: reads the IBPLOT array, as generated by PEGSUS code, one zone at a time.
Calling routines: main, out1planetoproc_break, out1planetoproc_nobreak, outallplanestoproc_break, outallplanestoproc_nobreak, read_compout.
Called routines, in order of appearance: none.

read_intout: reads the INTOUT file, as generated by the PEGSUS code, one zone at a time. It includes the IBLANK PEGSUS code array.
Calling routines: main, out1planetoproc_nobreak, outallplanestoproc_break, outallplanestoproc_nobreak.
Called routines, in order of appearance: exit, exit.

read_zone: sequentially reads the grid file one zone at a time. The grid file read in by this subroutine is assumed to be a 3-d PLOT3D formatted multi-zone file. The read pointer has been positioned past the header data by previously calling subroutine read_zone_header.
Calling routines: nobreak, out1planetoplt3d_break, out1planetoplt3d_nobreak, out1planetoproc_break, out1planetoproc_nobreak, outallplanestoplt3d_break, outallplanestoplt3d_nobreak, outallplanestoproc_break, outallplanestoproc_nobreak.

Called routines, in order of appearance: none.

read_zone_header: reads the grid file header and leaves the read pointer at the start of the grid points for the first zone. The grid file read in by this subroutine is assumed to be a 3-d PLOT3D formatted multi-zone file.
Calling routines: nobreak, out1planetoplt3d_break, out1planetoplt3d_nobreak, out1planetoproc_break, out1planetoproc_nobreak, outallplanestoplt3d_break, outallplanestoplt3d_nobreak, outallplanestoproc_break, outallplanestoproc_nobreak.
Called routines, in order of appearance: none.

sort: reads data from scratch file SCRATCH25, sorts on the base processor, then sorts the target processor for each base processor, so a double sort is needed. Scratch file SCRATCH30 is used as a temporary scratch file between sorts.
Calling routines: link_overset, nobreak.
Called routines, in order of appearance: indexx, indexx.

subgrid_dimensions: calculates the dimensions of the subgrids.
Calling routines: break, breakup_for_fun.
Called routines, in order of appearance: none.

target_search: searches for target points for overset Chimera-type grids.
Calling routines: main.
Called routines, in order of appearance: get_zone, get_zone.

write_base_target_points: writes base (stencil) and target (boundary) points for each zone in PLOT3D format.
Calling routines: main.
Called routines, in order of appearance: none.

writegrids: writes grids, read from PEGUS output, in PLOT3D format. The data in this format is read in later and subdivided into the user-specified number of subgrids.
Calling routines: read_compout.
Called routines, in order of appearance: none.

write_subgrids: writes out the subgrids formed in subroutine subgrid_dimensions and subroutine global_indices.
Calling routines: break, breakup_for_fun.
Called routines, in order of appearance: get_global_index.

write_unravel: outputs to file UNRAVEL. Output depends on iflag.
Calling routines: main, link_overlap.
Called routines, in order of appearance: none.

List of Selected Breakup Variables j_subgrid(index,nz); k_subgrid(index,nz); l_subgrid (index,nz): jmax, kmax, lmax of each subgrid, where index=(j-I)*idimk(nz)*idiml(nz)+(k-1)*idiml(nz)+1.

idimj(nz); idimk(nz); idiml (nz): number of subgrids for each overset grid.

jindex_global (index, nz); kindex_global (index, nz); lindex_global (index, nz): indices for each subgrid based on total dimension of the grid in which the subgrid resides; index=(j-I)*idimk(nz)*idiml(nz)+(k-1)*idimI(nz)+1.

x (index); y (index); z (index): x, y, and z for each zone nz. Note that if the zone is dimensioned jmax, kmax, lmax, then index=(j-I)*kmax*lmax+(k-1)*lmax+1, where j=1 to jmax, k=1 to kmax, l=1 to lmax.

xb(i,nz); yb(i,nz); zb(i,nz): locations for base points used in interpolation stencil.

jmax_compout(nz); kmax_compout(nz); lmax_compout(nz): indices from PEGSUS; dimensions for each zone, where (zone=1, nz).

jmax_intout(nz); kmax_intout(nz); lmax_intout(nz): indices from PEGSUS code for interpolation coefficients for each mesh.

ibpnts (nz): number of interpolation boundary points per mesh.

iipnts (nz): number of interpolation stencils/mesh.

iieptr (nz): end pointer for interpolation stencil list per mesh.

iisptr (nz): starting pointer for interpolation stencil list per mesh.

ji (i); ki (i); li (i): indices for target points from PEGSUS.

jb (i); kb (i), lb (i): indices for base points from PEGSUS.

ibc: interpolation boundary point pointer.

ibplot (index): array read in from PEGSUS file IBPLOT and is the IBLANK array typically used in plotting PLOT3D files.

iblank(index): array read in from PEGSUS file INTOUT; used as a flag to the flow solver to tell it that particular boundary points are updated by PEGSUS interpolation and not by the solver.

dx (i); dy (i); dz (i): interpolation coefficients from PEGSUS.

Breakup User Options

Option 1—PEGSUS-formatted Generic Overset Grids

This is the most powerful option. Output from the PEGSUS code, which includes the grids, interpolation coefficients, and other necessary data, is read in. The grids are then subdivided, connectivity tables constructed, and the data output for parallel processing. It also allows leaving the original grids intact but constructing connectivity tables for parallel processing. This implies that each overset grid would reside on one processor with no intra-grid message passing needed.

Option 2—PLOT3D-formatted Multiple Grids, No Interpolation Coefficients, Subgrid Overlap Enforced This is a versatile option. It was envisioned that an option was needed so that the user could prepare grids for parallel processing without necessarily having PEGSUS output. Hence, the user could examine the output of BREAKUP, for example, to aid in determining how the code subdivides the grids for a given number of processors.

The original overset grids are read in PLOT3D format instead of the PEGSUS former of Option 1. The subgrids of each separate grid are overlapped one grid cell by default. The overlap extent can be changed in the code internally.

Option 3—PLOT3D-formatted Multiple Grids, No Interpolation Coefficients, No Subgrid Overlap Enforced; or Internally Generated Grid This option includes Option 2 but without the overlap. It also allows the user to run BREAKUP as a stand-alone code without the need for externally generated grids. Suboption a) internally generates a cubed grid. The user can then input any number of processors to divide the cube into the specified number of subgrids. This allows convenient experimentation with the code. Suboption b) requires an externally generated PLOT3D-formatted file.

Breakup Input Files

The options discussed above require either PEGSUS files or PLOT3D grid files for input to BREAKUP. PEGSUS output used as input to BREAKUP consists of the files listed in Table 10.

TABLE 10

| | |
|---|---|
| INTOUT | interpolation coefficient file |
| COMPOUT | composite (overset) grid file |
| IBPLOT | iblank file |

Breakup Output Files

Output files from BREAKUP are listed in Table 11 with brief explanations. Not all may be output during a run session since the particular options to do so may not be chosen by the user.

TABLE 11

| | |
|---|---|
| UNRAVELED | main output file to show user what BREAKUP did |
| BREAKUP.OUT | condensed version of screen output |
| POINTS_OUT | PLOT.D file for interpolation and boundary points |
| MESH_OUT | PLOT:D file for the 'iblank'ed mesh |
| 3D_OVERSET_TABLE | file containing base (points used for interpolation) and target zones (points to be interpolated), indices, interpolation coefficients |
| 2D_OVERSET_TABLE | decimated version of file 3D_OVERSET_TABLE for two-dimensional problems |
| GRIDS2D | PLOT3D file for all 2-D grids or subgrids |
| GRIDS3D | PLOT3D file for all 3-D grids or subgrids |
| 3D_PATCH_TABLE | table of 3-D grid overlap links between subgrids of an overset grid |
| 2D_PATCH_TABLE | table of 2-D grid overlap links between subgrids of an overset grid |
| GRID_ORIGINAL.G | Original grid file in subroutine |
| GRID_DIVIDED.G | PLOT3 D file of subgrids generated by BREAKUP |
| 2Dxxxx.FMT | 2D subgrid files where each subgrid is written to a separate file; xxxx = 0000 to 9999 |
| 3Dxxxx.FMT | 3D subgrid files where each subgrid is written to a separate file; xxxx = 0000 to 9999 |

Breakup Examples

Figure 8:
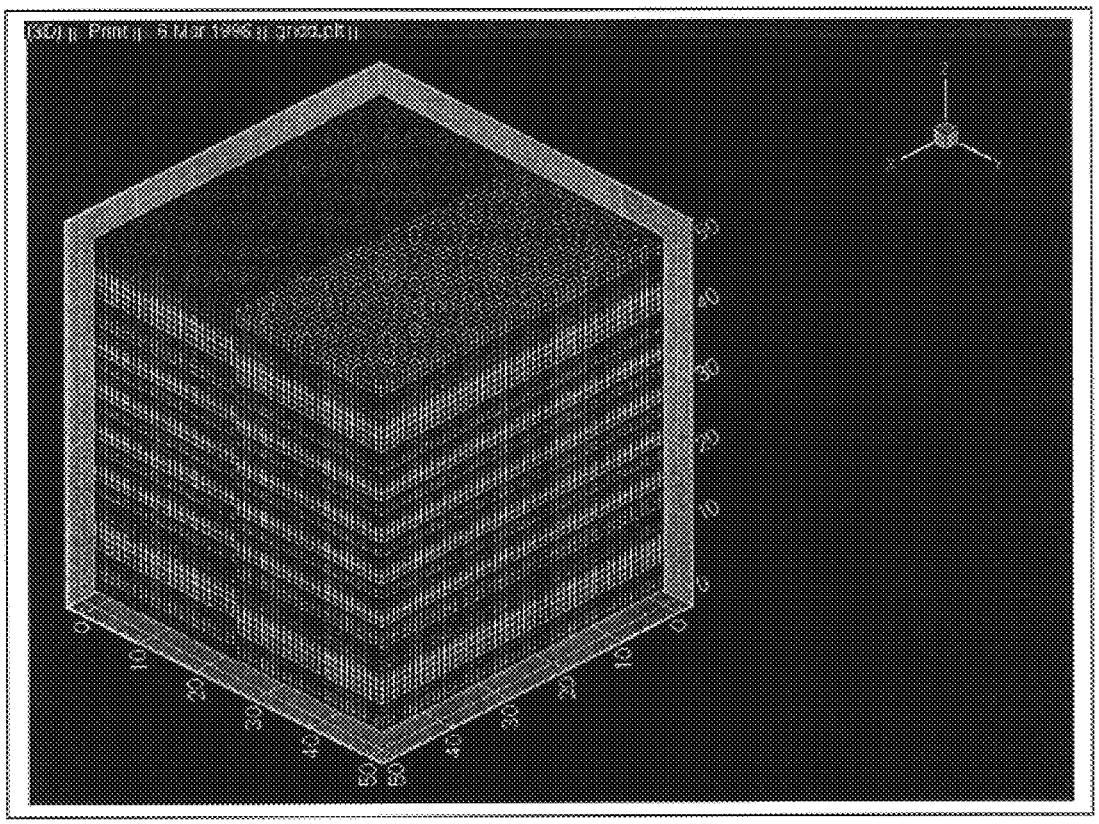
FIG. 8 is an example of results attained with the present invention.

The first example showing the utility of BREAKUP is presented in FIG. 8. A cube was internally generated and arbitrarily subdivided into 74 subgrids.

Figure 9A:
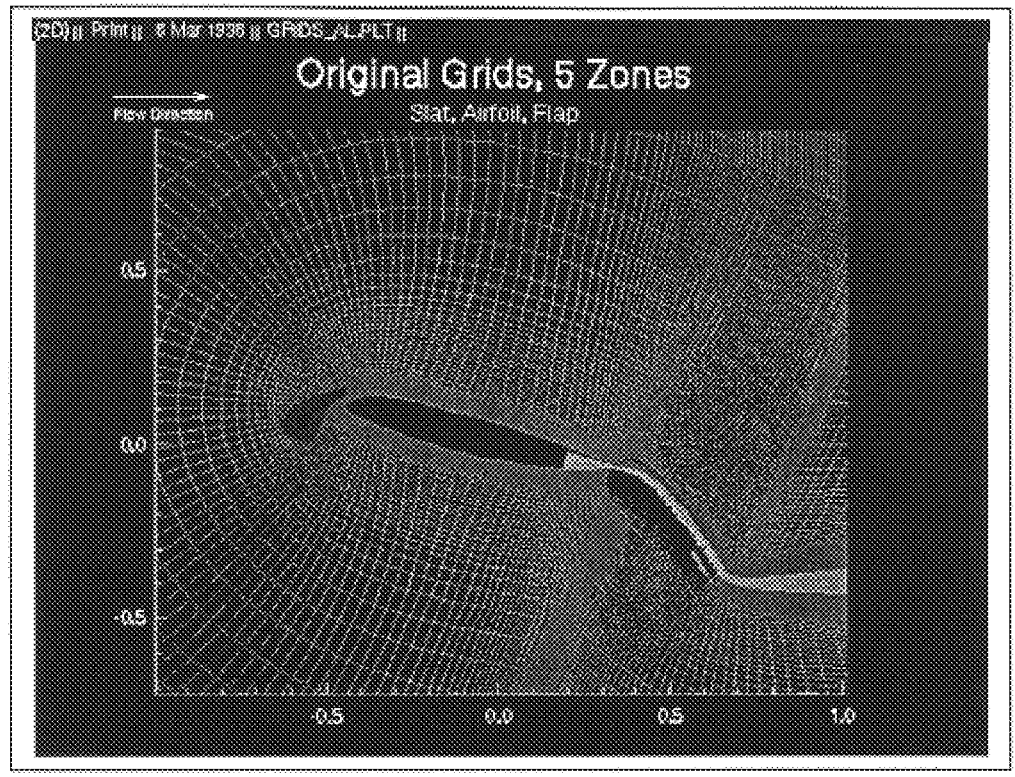
FIGS. 9(a,b,c) is an example of results attained with the present invention.
Figure 9B:
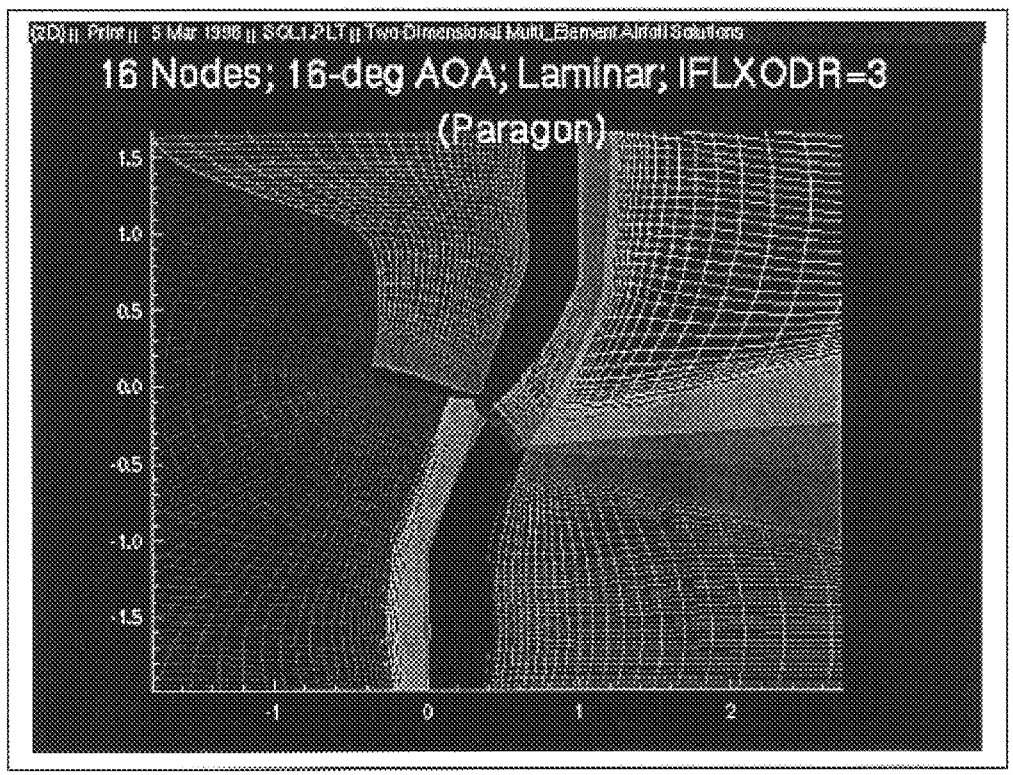
Figure 9C:
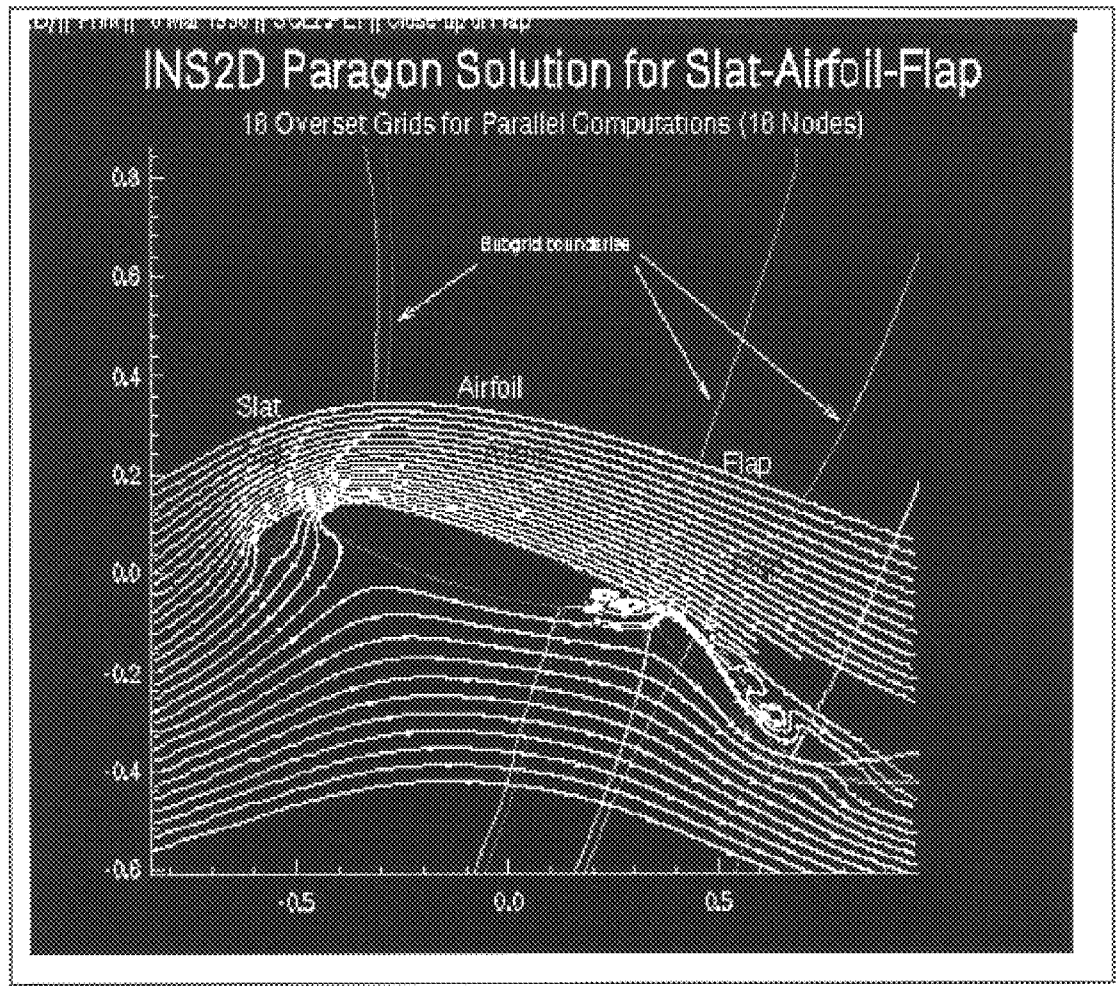

Another example demonstrating the power of BREAKUP is illustrated in FIGS. 9(a,b,c). The five grids generated around a multi-element airfoil are subdivided by BREAKUP into 16 grids for use on the corresponding number of processors. The original grids are presented in FIG. 9a and the divided grids in FIG. 9b. Presented in FIG. 9c is a close-up view of the solution. Smooth streamlines, even in recirculating regions, indicate that message passing between subgrids is behaving as expected. Note from this figure that BREAKUP did not subdivide the original grid around the slat. BREAKUP determined that the number of grid points for this grid was too few to subdivide further, given the number of user-specified processors. Parallel solutions for the airfoil were generated using a modified version of INS2D, a Navier-Stokes code described by Rogers et al. in "Steady and Unsteady Solutions of the Incompressible Navier-Stokes Equations", AIM Journal, Vol. 29, No. 4, April 1991, pp.603–610. Plots were generated using TECPLOT, a data visualization tool from Amtec Engineering, Inc., P.O. Box 3633, Bellevue, WA.

Figure 10A:
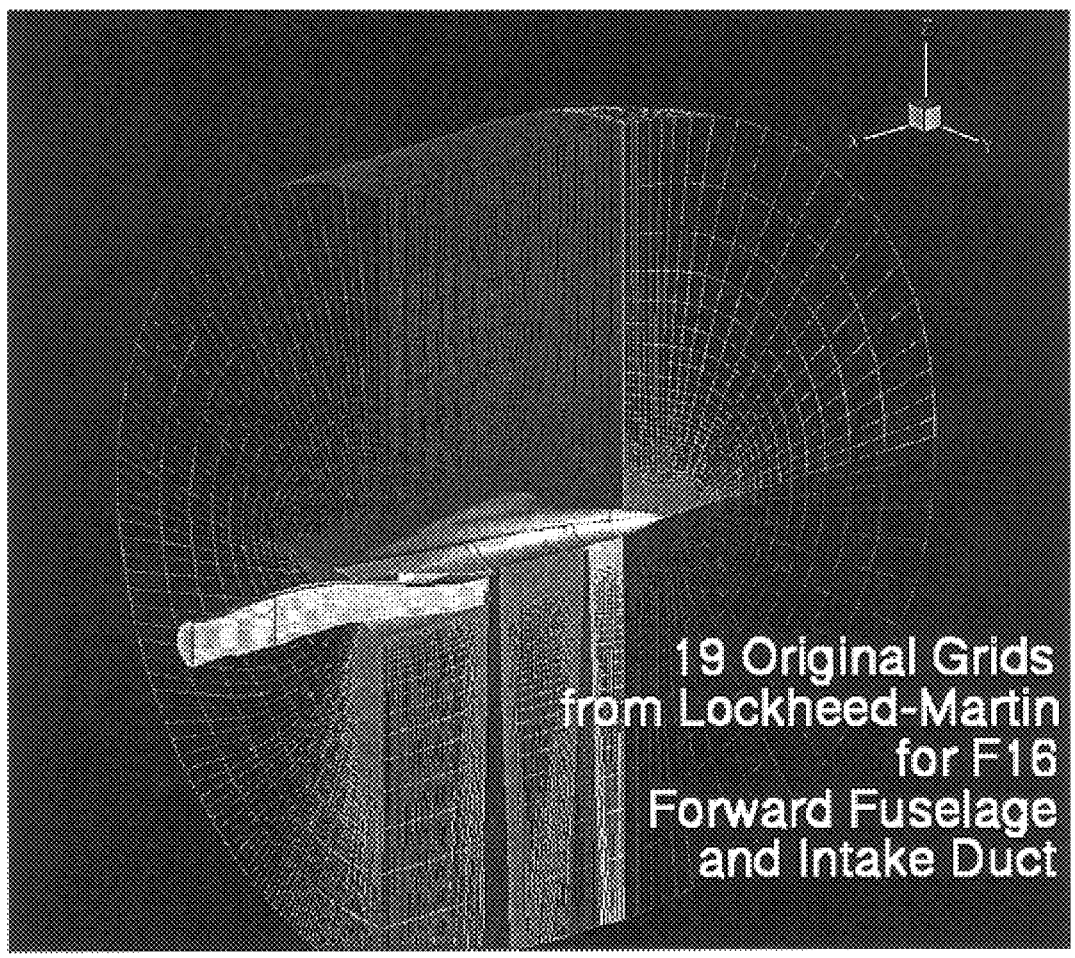
FIGS. 10(a,b) is an example of results attained with the present invention.
Figure 10B:
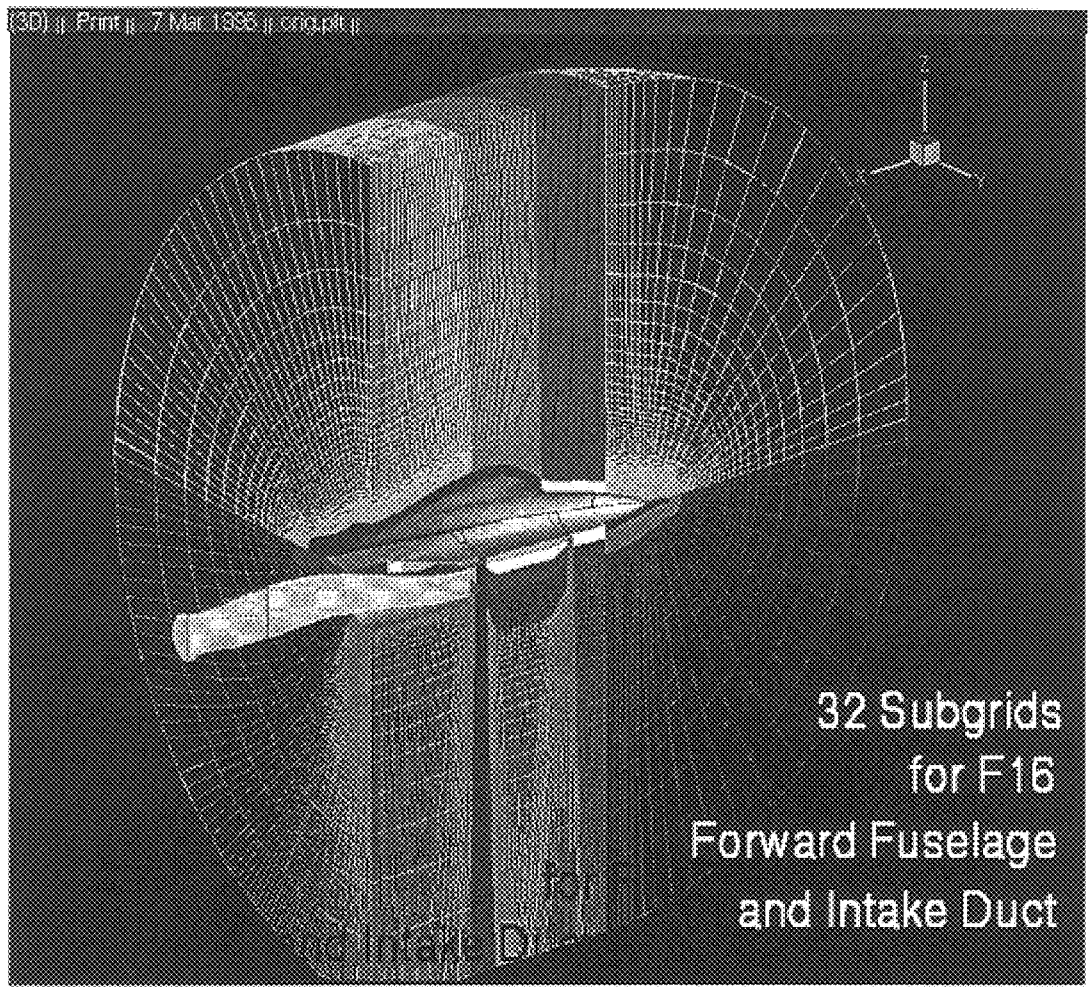
Figure 11A:
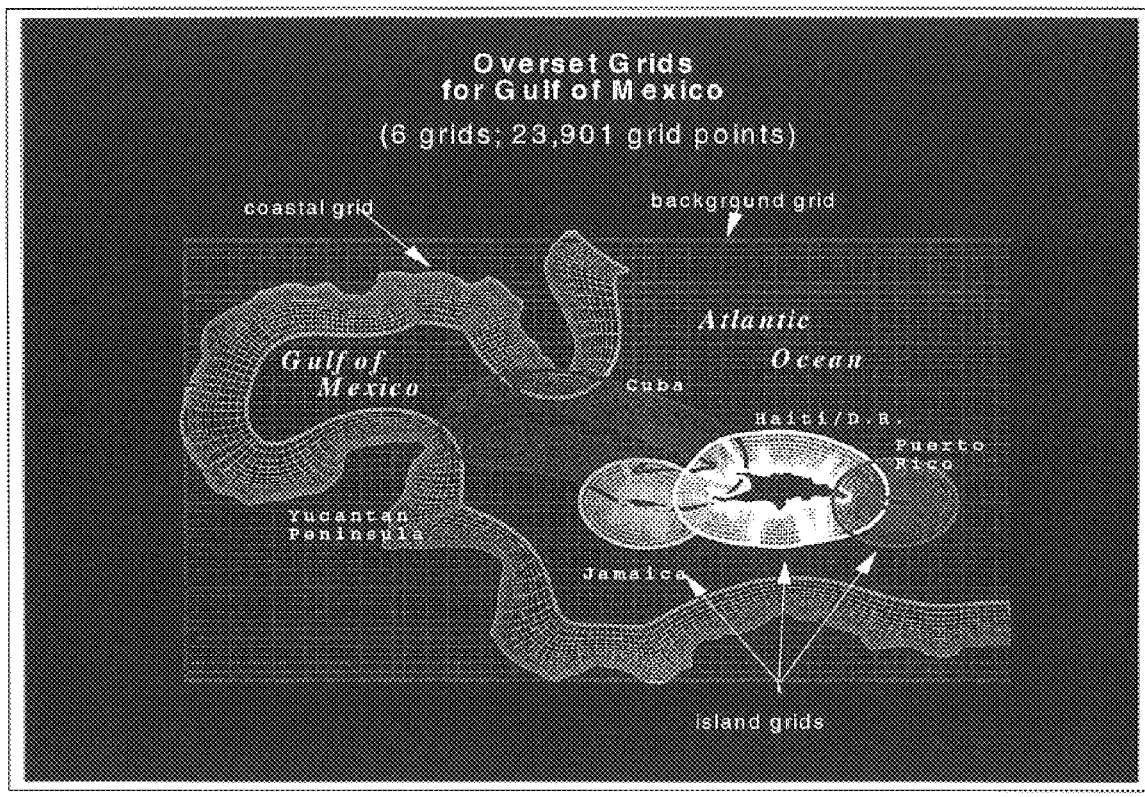
FIGS. 11 (a,b,c,d) is an example of results attained with the present invention.
Figure 11B:
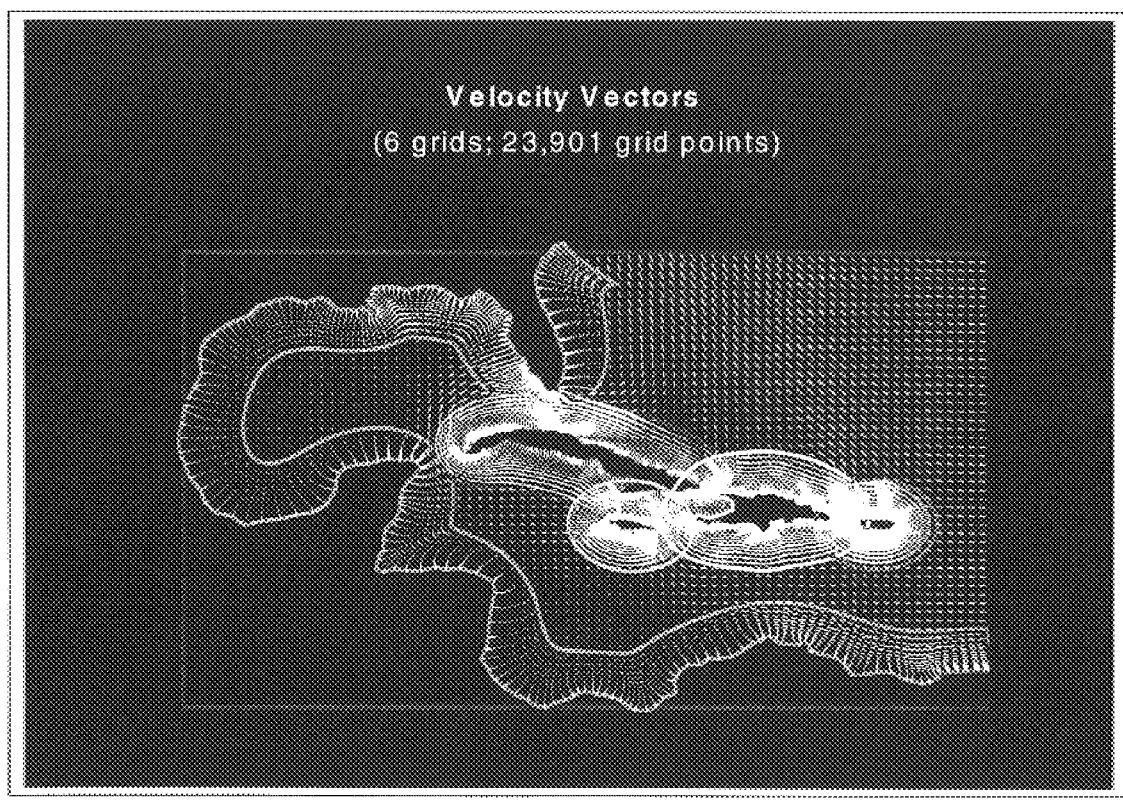
Figure 11C:
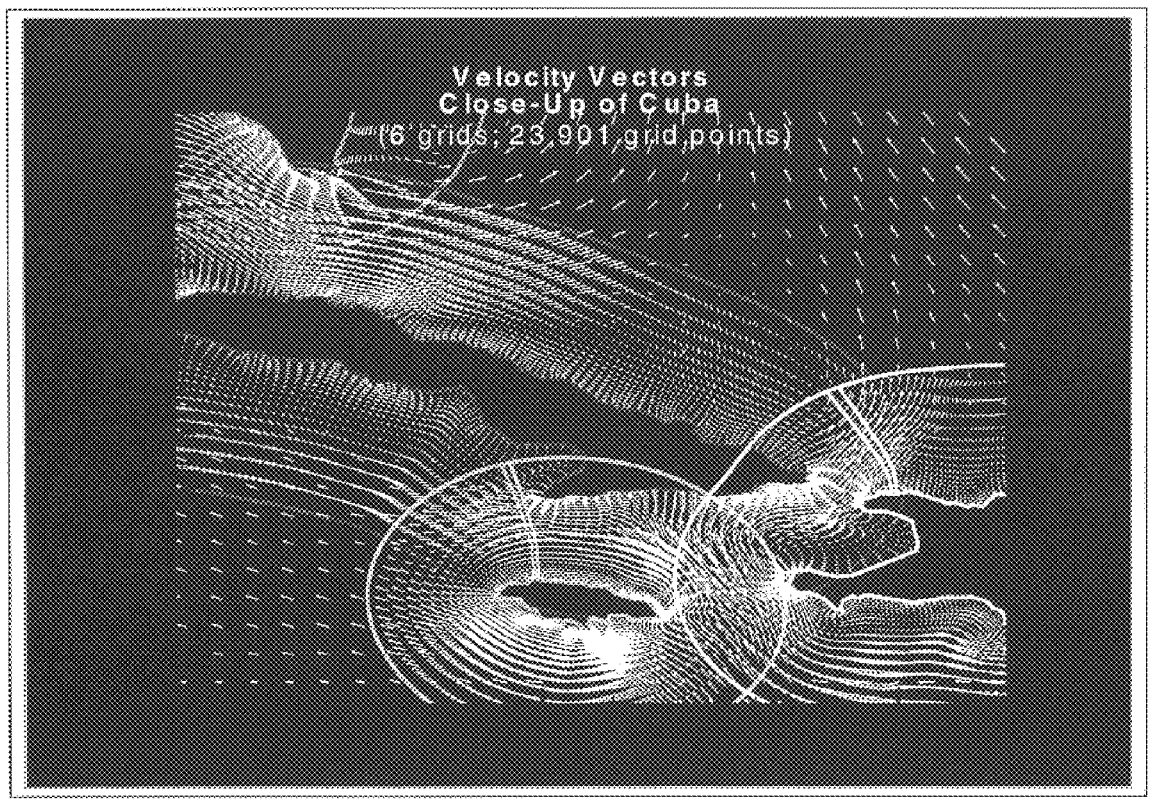
Figure 11D:
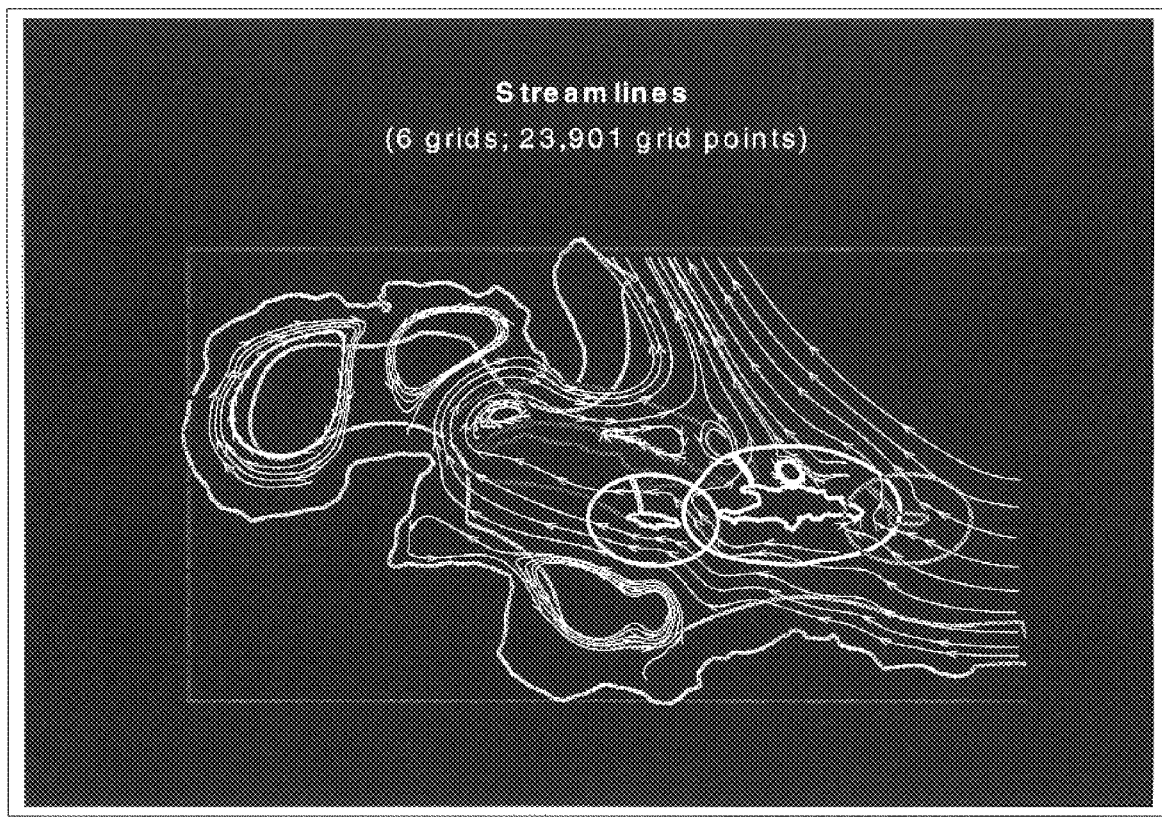

The next example, shown in FIGS. 10(a,b), is the for an F-16 forward fuselage and intake duct. Presented in FIG. 10a are the original 19 grids. Illustrated in FIG. 10b are the results of subdividing the original 19 grids into 32 subgrids.

Figure 12A:
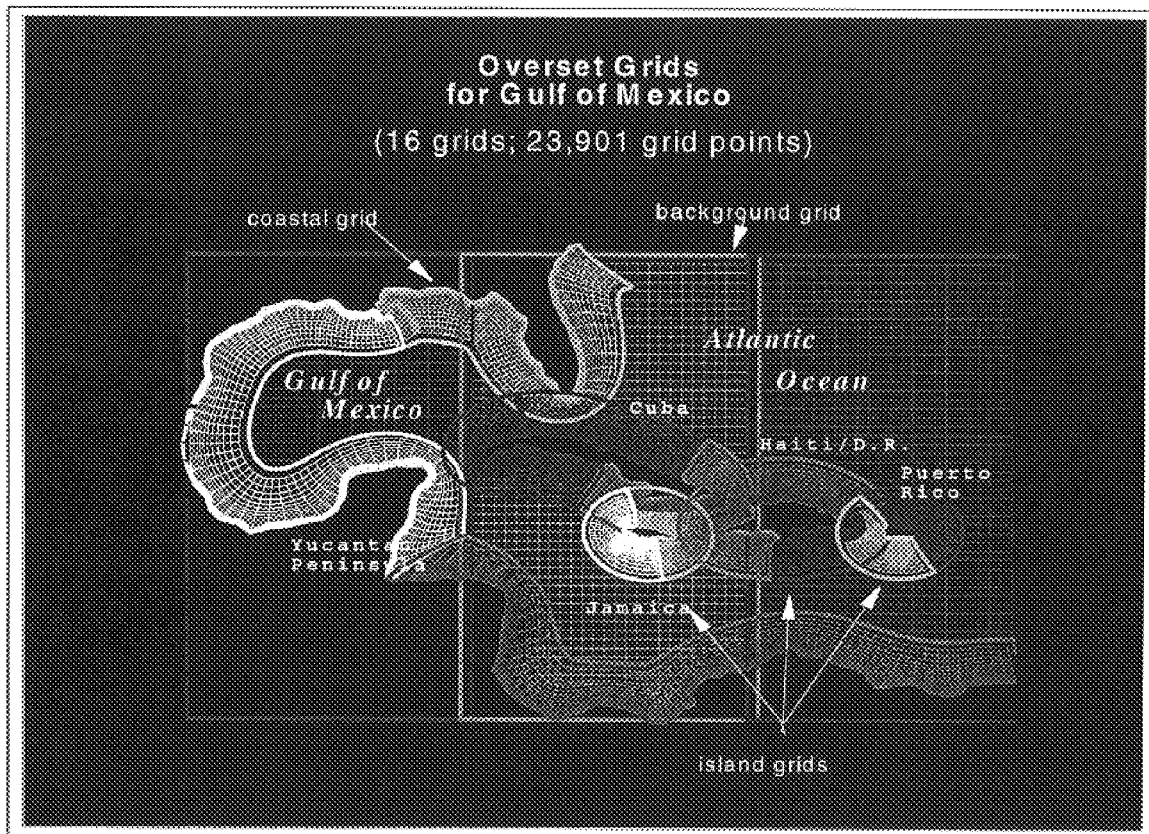
FIGS. 12(a,b) is an example of results attained with the present invention.
Figure 12B:
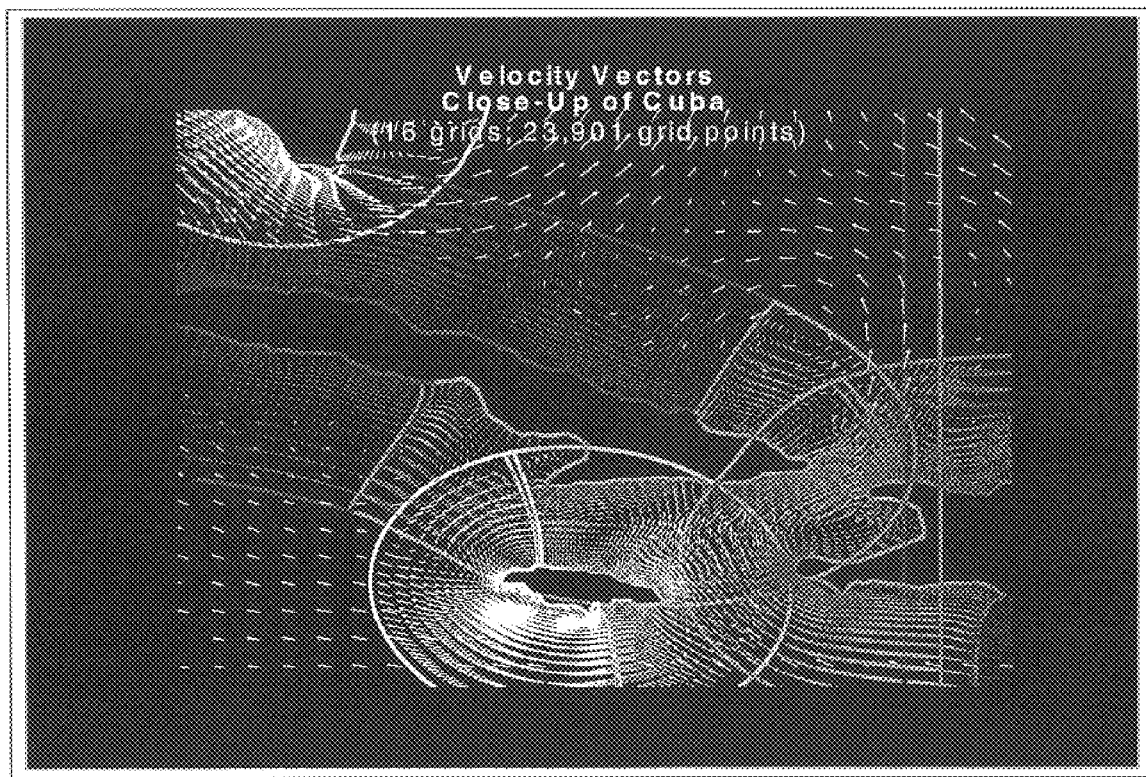
Figure 13A:
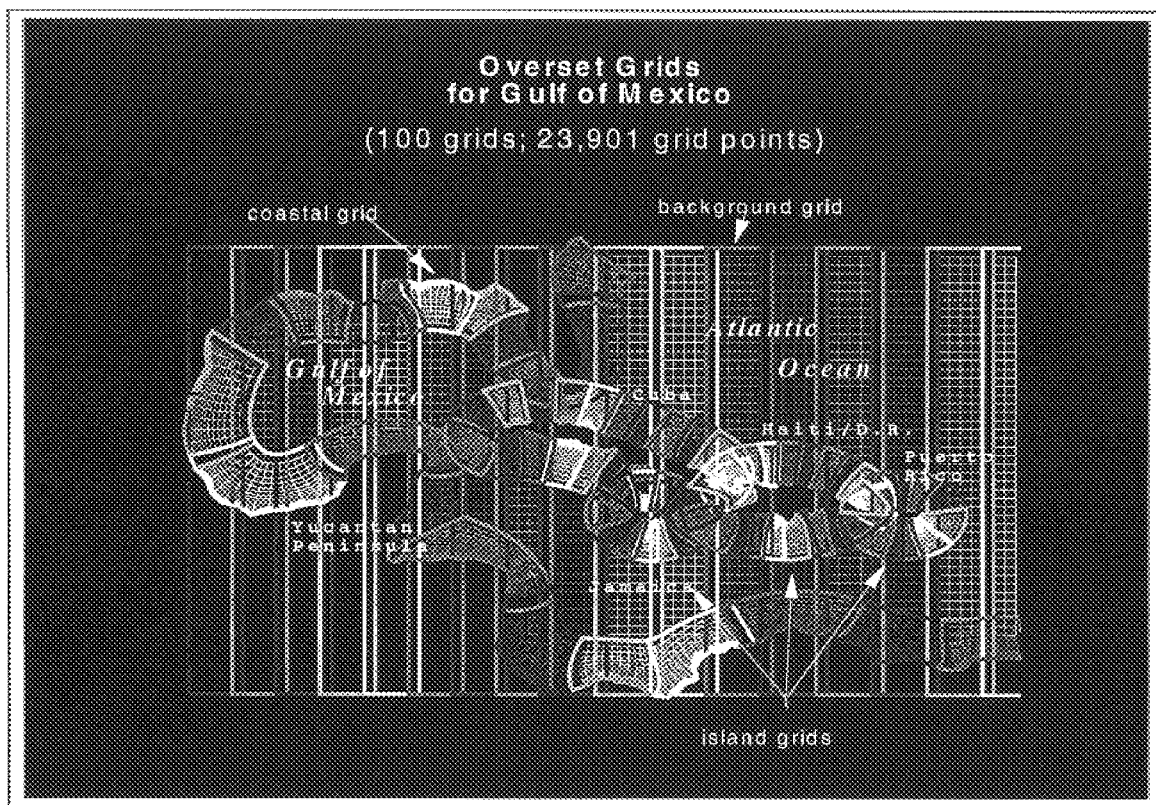
FIGS. 13(a,b) is an example of results attained with the present invention.
Figure 13B:
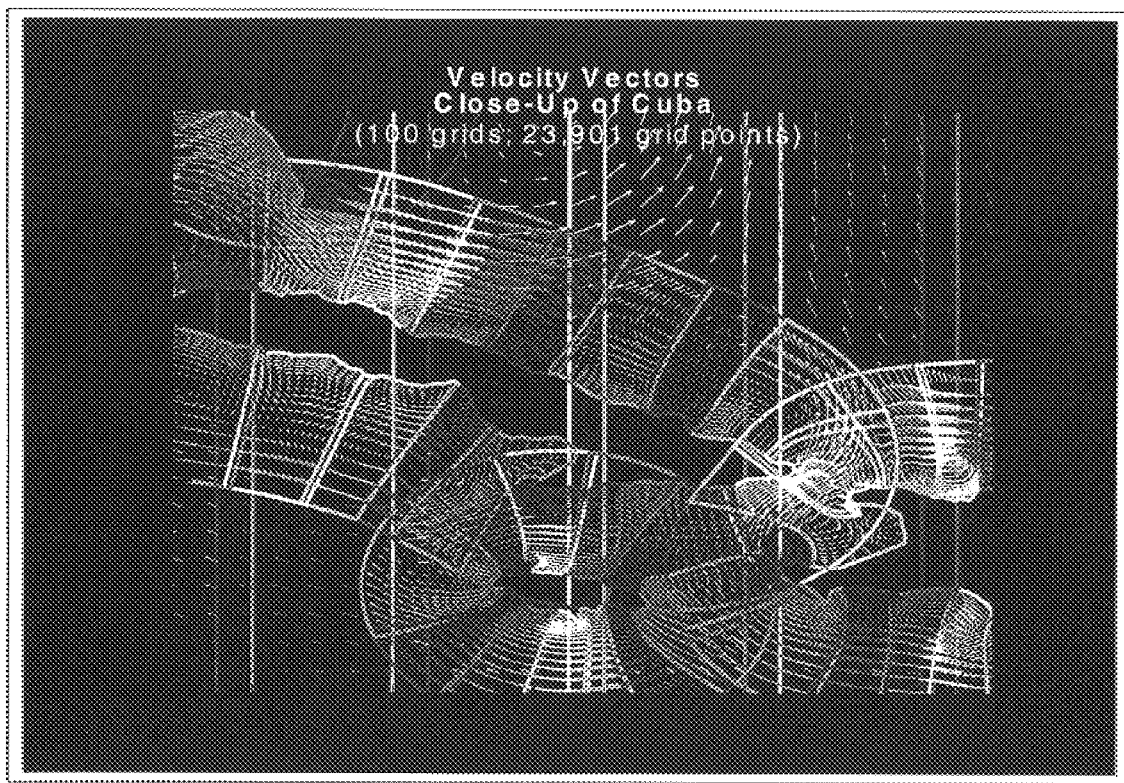

The last example, shown in FIGS. 11(a,b,c,d), 12(a,b), and 13(a,b), involves two-dimensional ocean current solutions on coastal grids for the Gulf of Mexico and Greater Antilles islands. None of the solutions were run to convergence since this representation is non-physical. The main objective was to determine whether BREAKUP was properly assigning subgrid interpolation coefficients to the processors. The original grids are presented in FIG. 11a. The solution on the original grids is presented in FIGS. 11 (b,c,d) showing velocity vectors, a close-up of the velocity vectors around Cuba, and streamlines, respectively. The original grids were then subdivided into a total of 16 subgrids as presented in FIG. 12a. As expected, BREAKUP subdivided the grids so that approximately the same number of grid points would reside on each processor. A close-up solution for the velocity vectors around Cuba is shown in FIG. 12b. Finally, the original grids were divided into 100 subgrids as shown in FIG. 13a. A close-up velocity vector plot is presented in FIG. 13b.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. A method for efficiently processing a field simulation acting upon or reacting to a geometrically complex configuration using an overset grid application on a multiprocessor computer, wherein an overset grid application comprises a plurality of overset grids and interpolation coefficients defining communication between points in different overset grids, comprising:

a) defining an overset grid application representative of a geometrically complex configuration;

b) associating each point within each overset grid with a processor by
   determining the number of points within said overset grid to associate with each of the processors in the multiprocessor computer, wherein the processing load on each processor is balanced; and
   for each processor, selecting said number points from said overset grid for association with said processor as a subgrid, wherein communication between said subgrids is minimized;

c) selecting an initial overset subgrid;

d) determining values for points in said initial overset subgrid;

e) selecting a second overset subgrid;

f) selecting interpolation transformations from base points in said initial overset subgrid to target points in said second overset subgrid, and using said interpolation transformations and said base points to determine field values for said target points;

g) repeating steps c) through g) using said second overset subgrid as the initial overset subgrid until a terminal condition of the field simulation is reached.

2. The method of claim 1, wherein the step of determining the number of points to associate with each processor comprises dividing the number of points in said overset grid by the number of processors in the multiprocessor computer.

3. The method of claim 1, wherein the step of selecting said number of points comprises dividing said overset grid into subgrids, wherein each of said subgrids corresponds to a processor and includes the determined number of points to be associated with said processor.

4. The method of claim 3, wherein the step of dividing said overset grid into subgrids includes adjusting the boundaries of each of said subgrids to minimize communications between subgrids.

5. The method of claim 4, wherein the subgrids are defined
for a 2 dimensional grid application, to minimize the total of the ratios of the perimeter distance to surface area for each of said subgrids; or
for a 3 dimensional grid application, to minimize the total of the ratios of surface area to volume of each of said subgrids.

6. The method of claim 1, wherein the step of associating each point within each overset grid with a processor further comprises, for each interpolation transformation, establishing communication paths from processors associated with base points of said interpolation transformation to processors associated with target points of said interpolation transformation.

7. A method of preparing a field simulation using an overset grid application for efficient operation on a multiprocessor computer comprising:
defining an overset grid application representative of a geometrically complex configuration;
partitioning each said overset grid into a number of subgrids equal to the number of processors upon which said grid application will be operated on by said computer;
associating each subgrid with a different processor;
forming a connectivity table identifying, for each interpolation t formation in the overset grid application, processors associated with said interpolation tansformation's base points and target points; and
processing said subgrids until a terminal condition of the field simulation is reached.

8. The method of claim 7, wherein the connectivity table further identifies, for each point on a boundary of a subgrid, processors associated with neighboring points in the same or adjacent overset grids.

9. The method of claim 7, wherein points for each subgrid are defined such that the total surface area to volume ratio of the subgrids is substantially minimized, which minimizes total communication time between subgrids for computational efficiency.

10. A method of efficiently operating a multiprocessor computer to process a field simulation acting upon or reacting to a complex geometry using an overset grid application, wherein said overset grid application comprises a plurality of overset grids partitioned into a number of subgrids equal to the number of processors, associations of points within each subgrid with a processor for that subgrid, and a connectivity table identifying processors associated with neighboring points on subgrid boundaries and processors associated by base and target points of interpolation transformations, said method comprising:
a) accepting definitions of a plurality of subgrids into the multiprocessor;
b) accepting associations of points within each subgrid with processors into the multiprocessor;
c) accepting a connectivity table into said multiprocessor;
d) selecting an initial overset subgrid from the overset grid application;
e) determining values for points in said initial overset subgrid;
f) selecting a second overset subgrid from said overset grid application;
g) using the interpolation transformations, said connectivity table, and said values for points in said initial overset subgrid to determine field values for some of the points in said second overset subgrid;
h) determining values for other field points in said second overset subgrid; and
i) repeating steps f) through h) using said second overset subgrid as the initial overset subgrid until a terminal condition of said field simulation is reached.

11. The method of claim 5 wherein the step of determining the number of points to associate with each processor comprises
dividing the number of grid points in all overset grids by a user-supplied number of subgrids, this result being an average number of grid points per subgrid;
dividing the number of grid points in each grid by the average number of grid points per subgrid, wherein a small remainder from this division is an indication of desirable load balance; and
increasing the number or size of subgrids if such change yields better load balance.

* * * * *